United States Patent
Patel et al.

(10) Patent No.: US 10,230,210 B2
(45) Date of Patent: Mar. 12, 2019

(54) ACOUSTO-OPTIC TUNING OF LASERS

(71) Applicant: Pranalytica, Inc., Santa Monica, CA (US)

(72) Inventors: C. Kumar N. Patel, Los Angeles, CA (US); Arkadiy Lyakh, Santa Monica, CA (US)

(73) Assignee: PRANALYTICA, INC., Santa Monica, CA (US)

( * ) Notice: Subject to any disclaimer, the term of this patent is extended or adjusted under 35 U.S.C. 154(b) by 497 days.

(21) Appl. No.: 14/636,058

(22) Filed: Mar. 2, 2015

(65) Prior Publication Data
US 2018/0254603 A1 Sep. 6, 2018

Related U.S. Application Data

(60) Provisional application No. 61/947,067, filed on Mar. 3, 2014.

(51) Int. Cl.
*H01S 5/00* (2006.01)
*H01S 5/34* (2006.01)

(52) U.S. Cl.
CPC .......... *H01S 5/0085* (2013.01); *H01S 5/0071* (2013.01); *H01S 5/3401* (2013.01)

(58) Field of Classification Search
CPC ...... H01S 3/1068; H01S 5/1234; H01S 3/101; H01S 3/0619; H01S 3/117; H01S 5/02438; H01S 3/083; H01S 3/042
See application file for complete search history.

(56) References Cited

U.S. PATENT DOCUMENTS

| | | | | |
|---|---|---|---|---|
| 3,656,068 A | * | 4/1972 | Runge ................ | H01S 3/101 359/313 |
| 4,028,648 A | * | 6/1977 | Hartmann .......... | H03H 9/14508 310/313 B |
| 4,105,953 A | * | 8/1978 | Jernigan ............. | H01S 3/117 359/305 |
| 6,031,852 A | * | 2/2000 | Thompson .......... | H01S 3/1068 372/20 |
| 6,084,682 A | * | 7/2000 | Zare ................... | G01N 21/39 356/437 |
| 6,157,660 A | * | 12/2000 | Hill .................... | G02F 1/116 372/100 |
| 6,930,819 B2 | * | 8/2005 | Chu .................... | G02F 1/116 359/285 |
| 7,873,081 B1 | * | 1/2011 | Gao .................... | G02F 1/116 359/285 |

(Continued)

OTHER PUBLICATIONS

G.P. Luo, C. Peng, H. Q. Le,, S. S. Pei, W.-Y. Hwang, B. Ishaug, J. Um, J. N. Baillargeon, and C.-H. Lin, "Grating-tuned external-cavity quantum-cascade semiconductor lasers", *Appl. Phys. Lett.* 78, 2834 (2001).

(Continued)

*Primary Examiner* — Yuanda Zhang
(74) *Attorney, Agent, or Firm* — Cislo & Thomas, LLP

(57) ABSTRACT

A semiconductor laser tuned with an acousto-optic modulator. The acousto-optic modulator may generate standing waves or traveling waves. When traveling waves are used, a second acousto-optic modulator may be used in a reverse orientation to cancel out a chirp created in the first acousto-optic modulator. The acousto-optic modulator may be used with standing-wave laser resonators or ring lasers.

6 Claims, 25 Drawing Sheets

(56) References Cited

U.S. PATENT DOCUMENTS

| | | | | |
|---|---|---|---|---|
| 8,369,367 | B1* | 2/2013 | Gao | H01S 5/0687 359/285 |
| 9,042,413 | B1* | 5/2015 | Brown | H01S 1/02 372/4 |
| 2005/0226557 | A1* | 10/2005 | Trutna, Jr. | H01S 3/083 385/37 |
| 2006/0050747 | A1* | 3/2006 | Trutna, Jr. | H01S 5/141 372/20 |
| 2012/0274929 | A1* | 11/2012 | Weidmann | G01N 21/45 356/128 |

OTHER PUBLICATIONS

Masaki Yumoto, Yasuhiro Maeda, Norihito Saito, et al., "Electrical Wavelength Tuning of Tunable Laser with Acousto-Optic Tunable Filter", *Jap.* 11, 8411-8415, (2008).

R. Maulini, M. Beck, J. Faist, and E. Gini, "Broadband tuning of external cavity bound-to continuum quantum cascade lasers", *Appl. Phys. Lett.* 84, 1659 (2004).

R. Maulini, D. A. Yarekha, J.-M. Bulliard, M. Giovannini, J. Faist, "Continuous-wave operation of a broadly tunable thermoelectrically cooled external cavity quantum cascade laser", *Opt. Lett.* 30, 2584 (2005).

David C. Thompson, George E. Bush, Clifford J. Hewitt, et al., "High-speed random access laser tuning", *Applied Optics* 38, 2545 (1999).

A. Lyakh, R. Maulini, A. Tsekoun, R. Go, and C. K. N. Patel, "Multiwatt long wavelength quantum cascade lasers based on high strain composition with 70% injection efficiency", *Opt. Expr.* 22, 24272 (2012).

Anthony E. Siegman, Oscillation Dynamics and Oscillation Threshold, Lasers, pp. 532-534, ISBN: 0-935702-11-5, University Science Books, Mill Valley, CA, 1986.

* cited by examiner

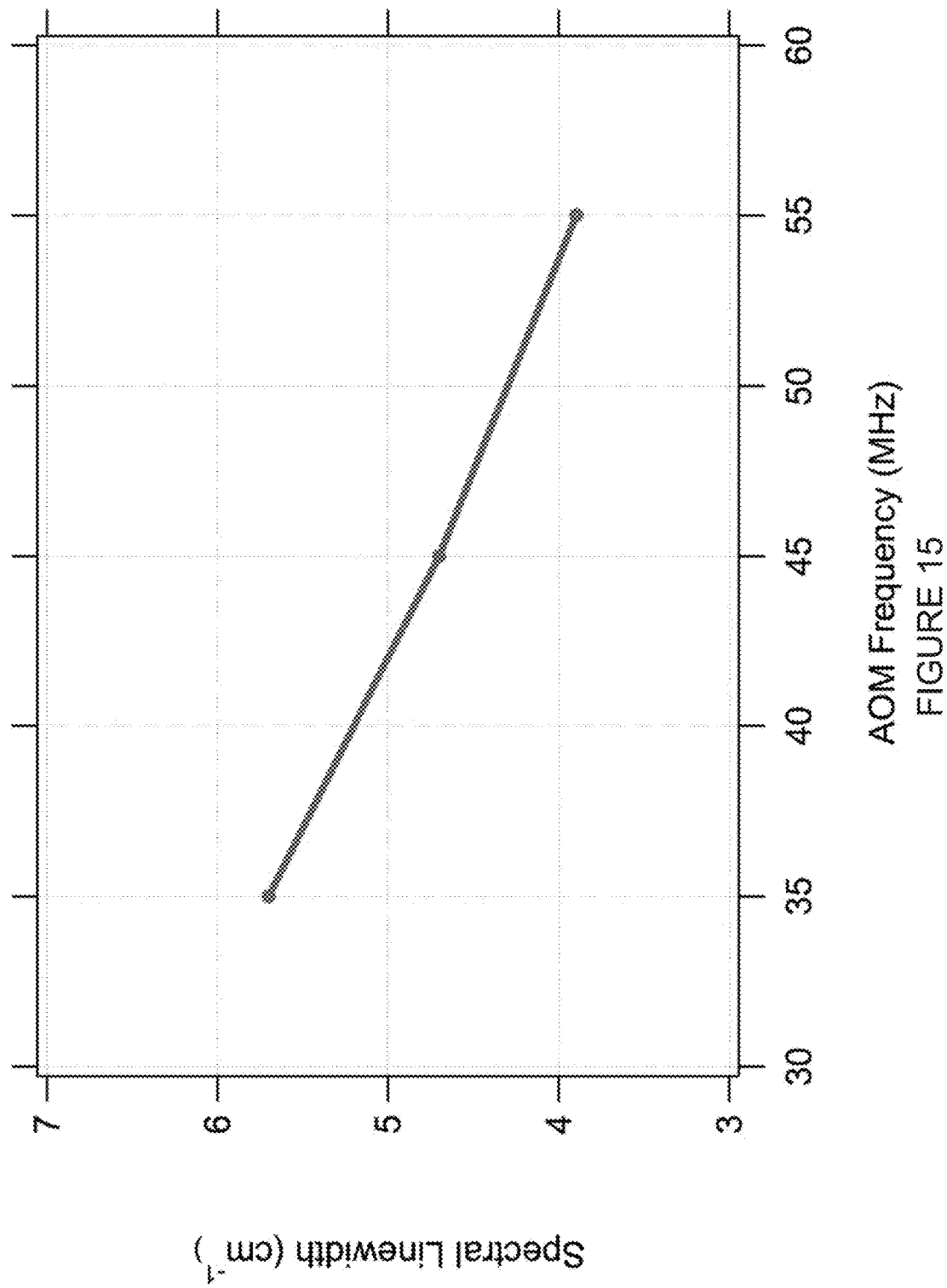

ACOUSTO-OPTIC TUNING OF LASERS

CROSS-REFERENCE TO RELATED APPLICATION

This patent application claims the benefit of U.S. Provisional Patent Application Ser. No. 61/947,067, entitled "Acousto-Optic Tuning of QCLs and ICLs," filed Mar. 3, 2014, which application is incorporated in its entirety here by this reference.

TECHNICAL FIELD

This invention relates to tuning quantum cascade lasers and inter-band cascade lasers.

BACKGROUND

Quantum cascade lasers (QCL) are lasers in which the gain spectrum is typically broader than approximately 5% of the central wavelength of the laser. In typical configurations (such as Fabry-Perot configurations, exemplified by FIG. 2 without the grating 14), i.e., with one facet of the QCL 10 with high reflectivity coating and the exit facet with controlled reflectivity anti-reflection coating 12, the QCLs 10 will produce very high power output, approaching power greater than 4 W at a wavelength of approximately 4.6 micrometer. However, as shown in FIG. 1, this output occurs in a bandwidth of approximately 250 nm around the central wavelength.

Such broadband operation is acceptable when the precise wavelength or the bandwidth of the output is not critical, for example, for directional infrared countermeasures (DIRCM), targeting, beacon, and illumination applications. On the other hand, there are a significant number of very important applications, where the laser output must be narrow band, for example, less than 1 nm wide, and tunable over some wavelength region. These applications include spectroscopy and sensors for detection of pollutants, toxic gases and explosives. To obtain a "single frequency" output from a broadband gain spectrum laser such as a QCL, a wavelength dispersive element needs to be introduced within the laser cavity so that only one selected wavelength can resonate. Such dispersive elements include diffraction gratings 14 (FIGS. 2 and 3), prisms 18 (FIG. 4) and tunable or otherwise narrow band filters 20 (FIG. 5).

A key feature of all of these schemes is that mechanical motion is required to tune the wavelength of the laser since the wavelength selection is dependent on the angle as shown in the FIGS. 2-5. All the techniques shown in these figures permit tuning of the laser wavelength over the entire gain spectrum (as long as the round trip optical gain exceeds total cavity losses). But, the tuning is slow because of the mechanical motion of a discrete, dispersive element (grating, prism or filter) and not appropriate for applications calling for ruggedness, such as for sensors that would be deployed in the field, carried by personnel or mounted on vehicles. There are many applications that require very rapid tuning because there is a need to obtain a complete spectrum of the object under examination in a very short time. Such applications include studies of time dependent combustion dynamics and explosion dynamics, time dependent spectral changes during chemical and biological reactions, rapid examination of an improvised explosive device in standoff detection mode and tracking the release of toxic gases.

There is yet another way of obtaining narrow linewidth output from an otherwise broadband QCL. This is the use of distributed feedback grating, which is embedded within the gain structure of the laser. Such lasers are useful because they are simple to fabricate and are rugged. However, tunability is quite limited around the design wavelength of the distributed Bragg grating. Typical tuning range for distributed feedback lasers (DFB) is limited to approximately 5 cm$^{-1}$ around the design wavelength of the grating. This is but a small fraction of the gain spectrum width of the QCL. The tuning can be carried out either by varying the QCL drive current or by changing the temperature of the QCL. In either case, no mechanical motion is required. The thermal tuning is slow while the electrical current driven tuning can be relatively fast. However, for obtaining broadband tuning, DFB lasers are inappropriate.

For the foregoing reasons there is a need for rugged, rapid broadband tuning of quantum cascade lasers.

SUMMARY

The present invention permits rapid broadband tuning of semiconductor lasers, such as quantum cascade lasers and interband cascade lasers, electronically without the use of any mechanical motion for the wavelength selection, by utilizing an acousto-optic modulator (also referred to herein as an acousto-optic filter), thereby improving the ruggedness of the laser. The acousto-optic modulator may generate traveling waves or standing waves. When using traveling waves, a second acousto-optic modulator may be used in the reverse orientation compared to the first acousto-optic modulator to cancel out any chirp from the first acousto-optic modulator. The acousto-optic modulator can be used with standing-wave laser resonators or ring lasers.

BRIEF DESCRIPTION OF DRAWINGS

FIG. 15 shows a graph of emission spectrum linewidth dependence on acousto-optic modulator central frequency.

DETAILED DESCRIPTION OF THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Emission wavelength of a single Fabry-Perot (FP) QCL chip with an anti-reflection-coated back facet is controlled with a dispersive element located outside the laser medium, i.e. using the external cavity (EC) approach. However, in contrast to traditional external cavity QCLs with a moving grating for example, the rapid wavelength tuning in the present invention is achieved using an electrically controlled acousto-optic modulator (AOM) 106. Compared with the DFB configuration, the present invention provides continuous tunability of the lasing wavelength over the entire gain bandwidth of the QCL; and compared with EC QCLs with a grating, which do provide continuous and broad tunability, the present invention has no moving parts.

Figure 1:
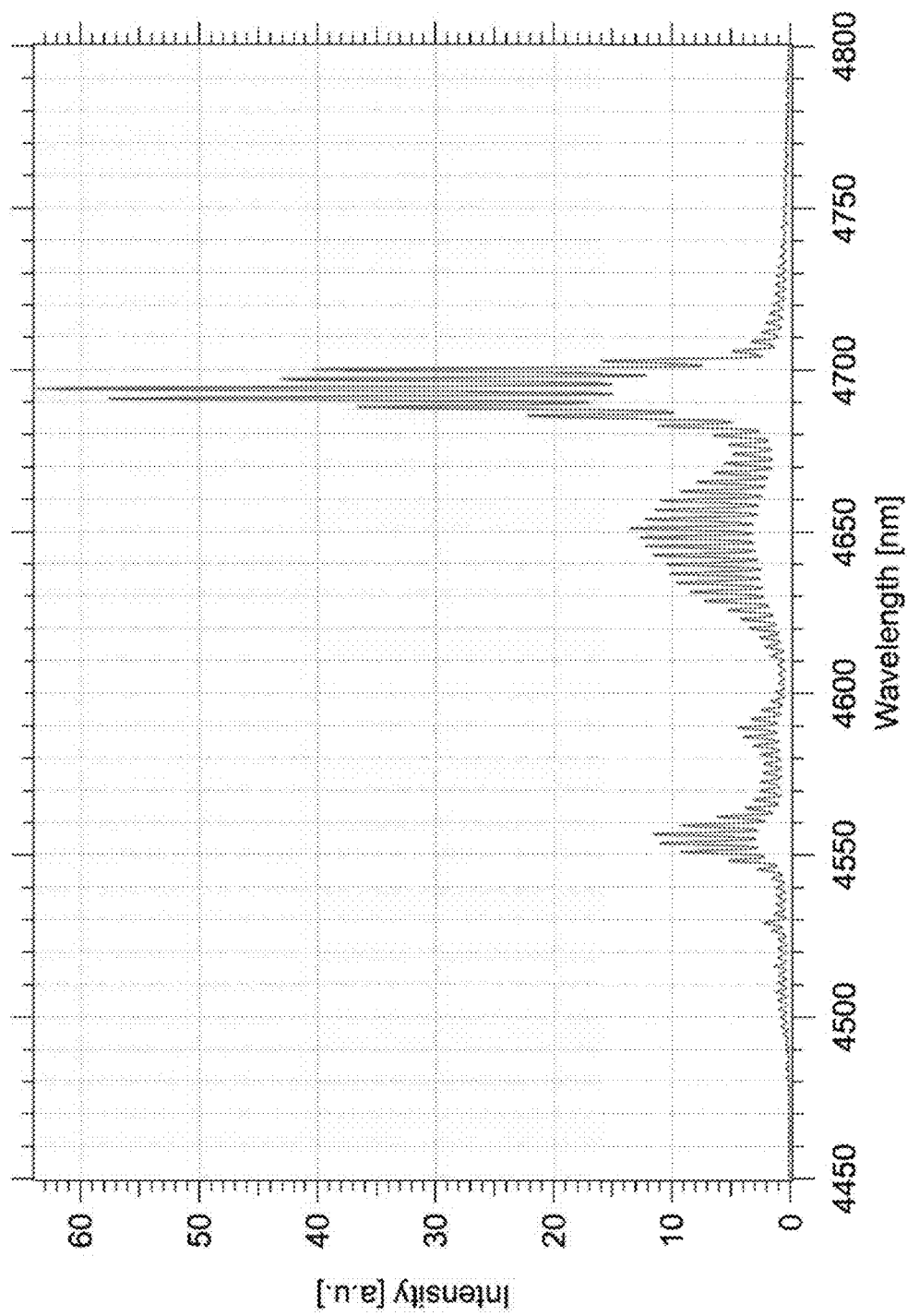
FIG. 1 is a graph of a spectral output from a MWIR high power quantum cascade laser in Fabry-Perot configuration (no internal wavelength dispersion component).
Figure 2:
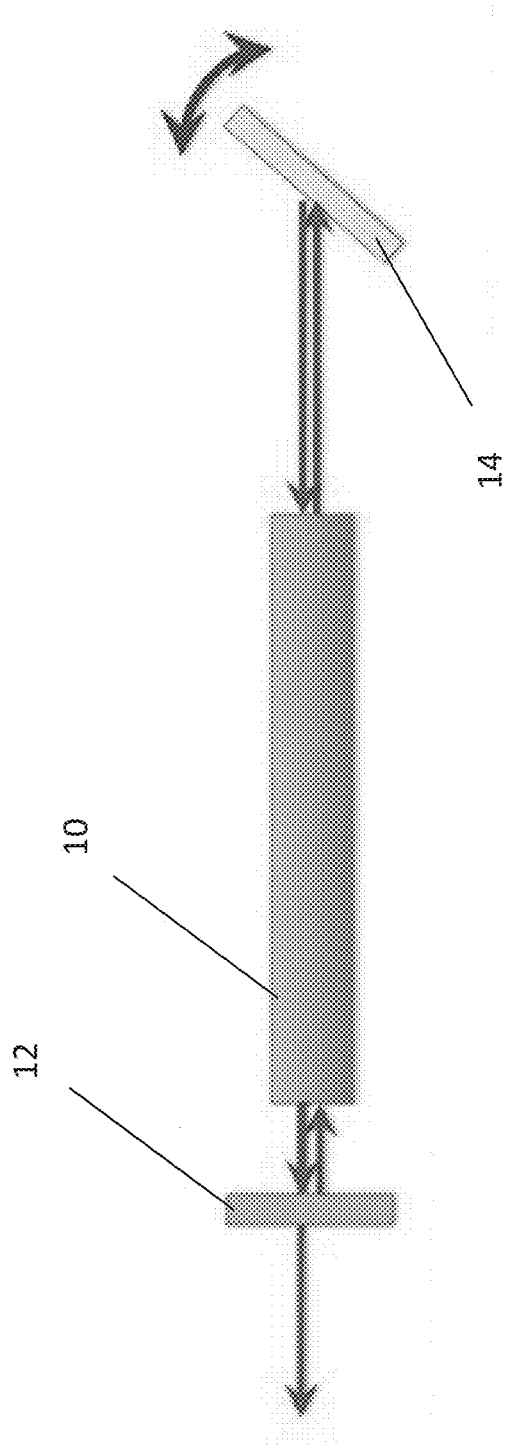
FIG. 2 shows a schematic of a diffraction grating tuned broadband laser (Littrow configuration).
Figure 3:
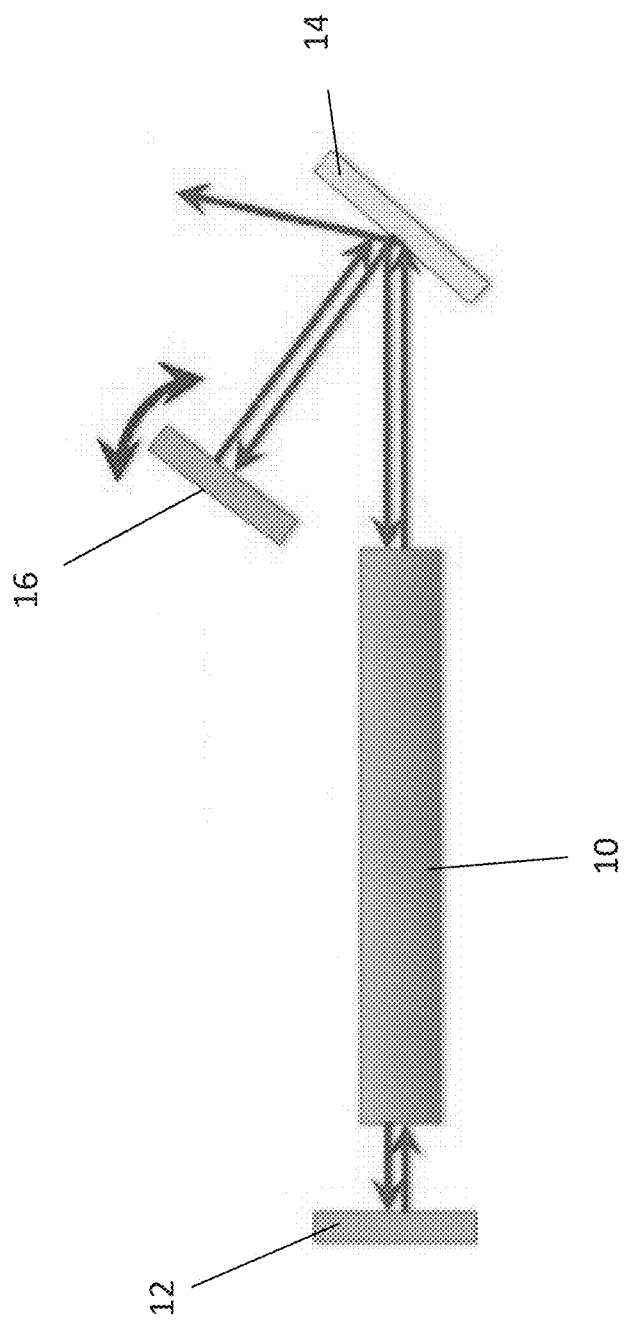
FIG. 3 shows a schematic of another diffraction grating tuned broadband laser (Littman-Metcalf configuration).
Figure 4:
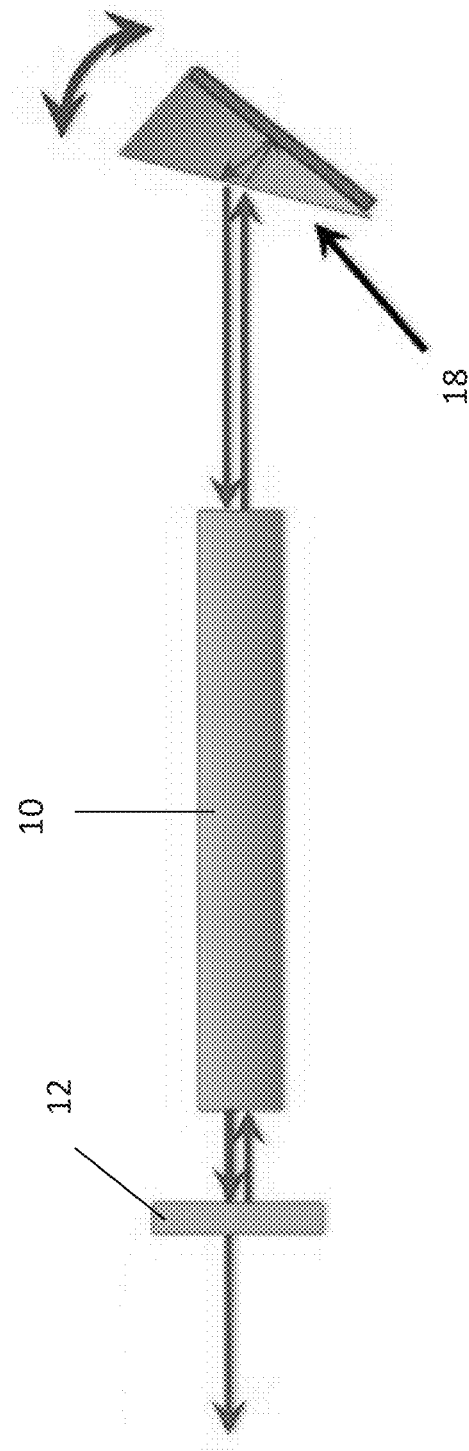
FIG. 4 shows a schematic of a prism tuned broadband laser.
Figure 5:
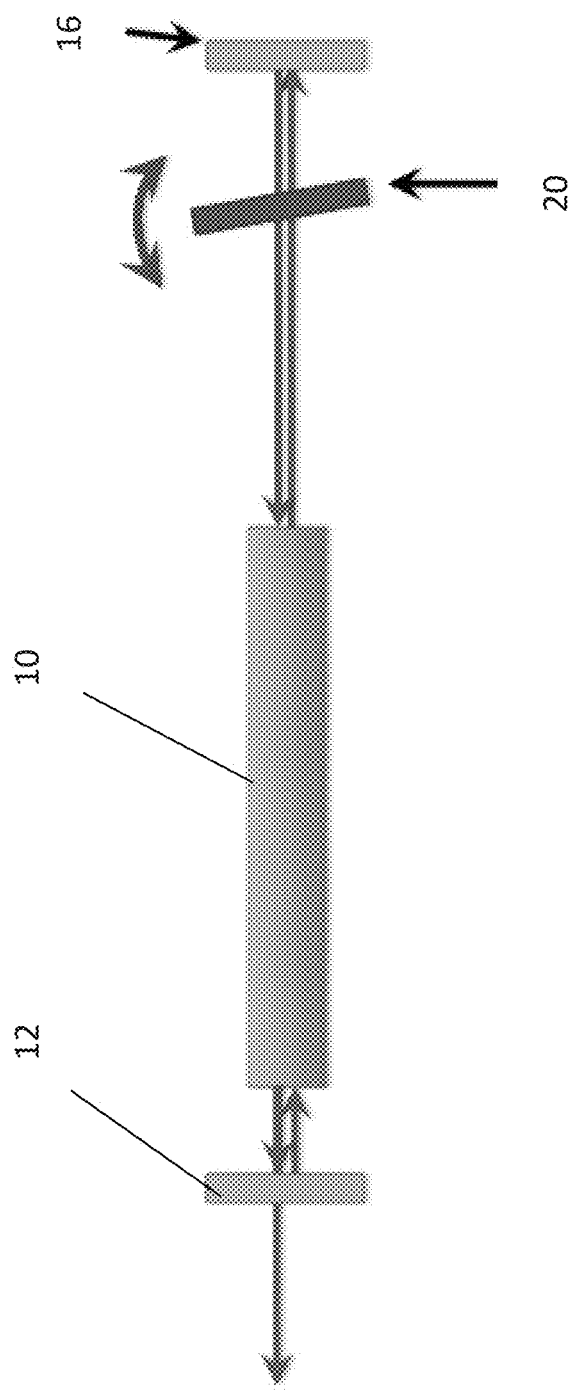
FIG. 5 shows a schematic of a narrow bandwidth filter tuned broadband laser.
Figure 6:
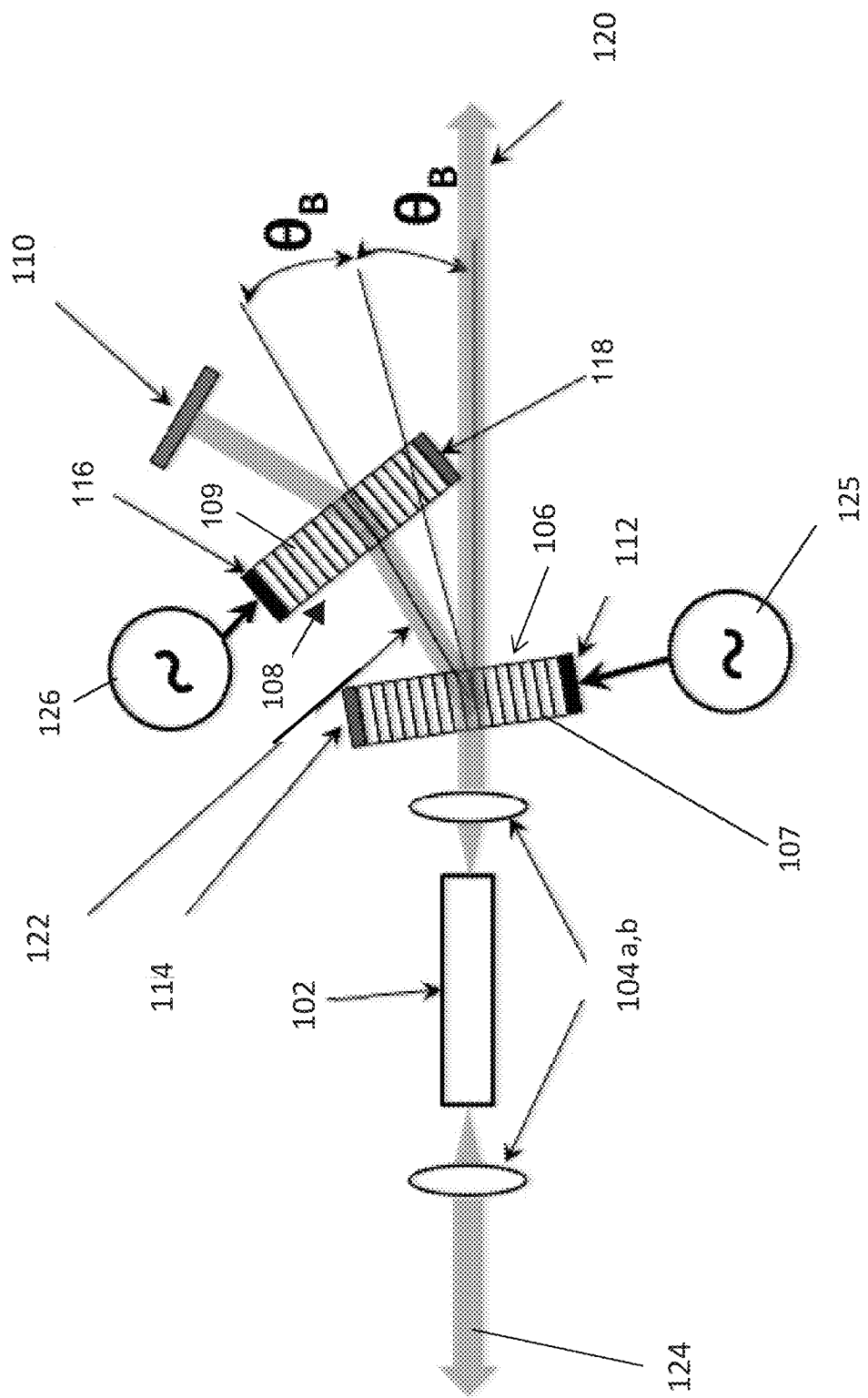
FIG. 6 shows a schematic of an embodiment of an acousto-optic modulator (filter) tuned quantum cascade laser.
Figure 7:
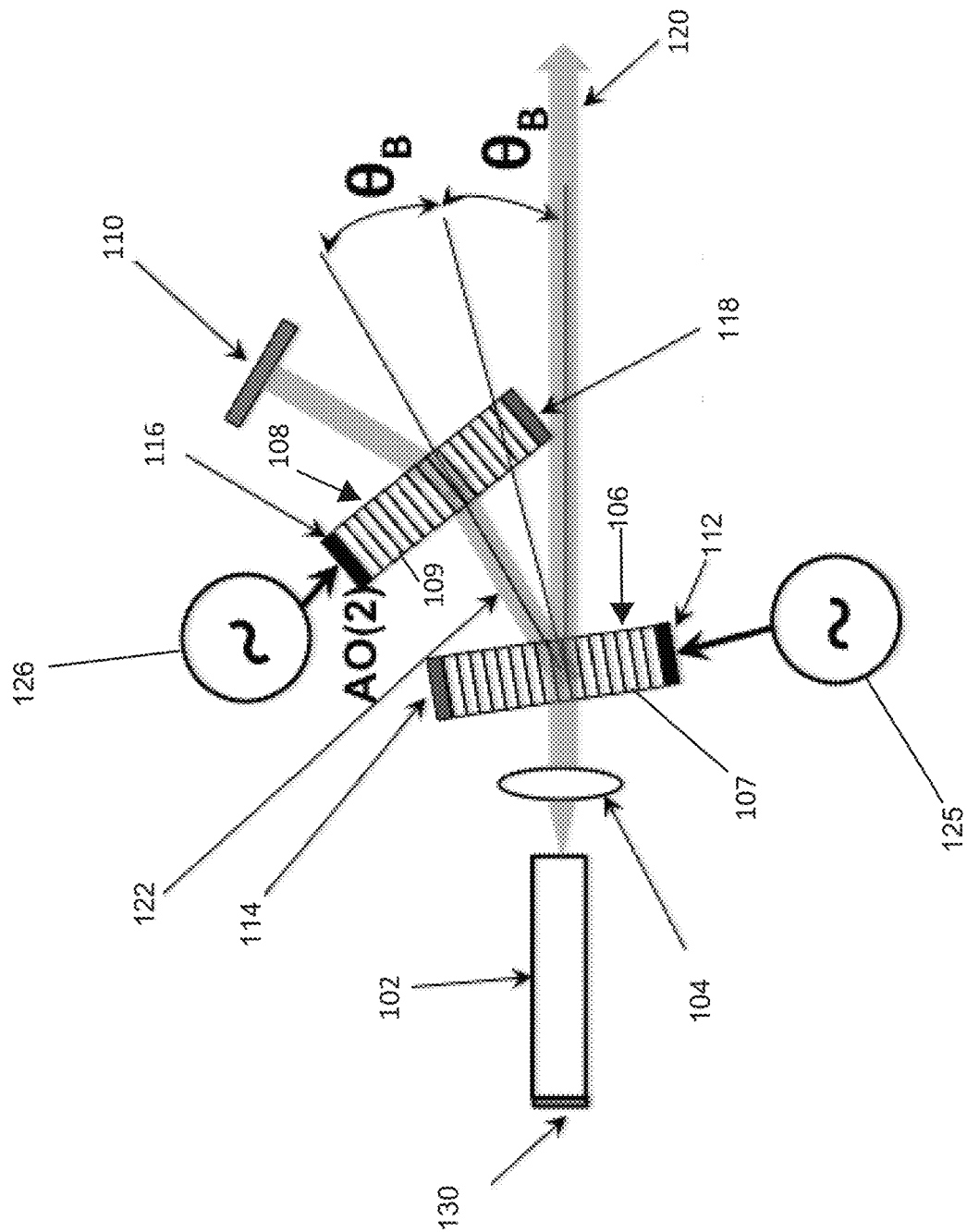
FIG. 7 shows a schematic of another embodiment of an acousto-optic modulator (filter) tuned quantum cascade laser.

An AOM 106 comprises a transparent material 107 having a piezoelectric transducer 112 attached at one end and acoustic absorber 114 attached at the opposite end. The piezoelectric transducer 112 creates a sound wave that is propagated through the transparent material 107 towards the acoustic absorber 114. In particular, high-frequency acoustic wave in AOMs 106 may be generated in a transparent material 107 (germanium in case of long wavelength infrared (LWIR) region) and this acoustic wave forms an index grating. In some embodiments, two AOMs 106, 108, with opposed travelling acoustic waves, may be used so that the Doppler frequency shift in the optical wave introduced by the first AOM 106 is cancelled by the complementary Doppler shift introduced by the second AOM 108. In other words, the second AOM 108 comprises a transparent material 109 having a first end and a second end, a second piezoelectric transducer 118 at the first end and a second acoustic absorber 116 at the second end, wherein the orientation of the second AOM 108 is reversed compared to the first AOM 106 as shown in FIGS. 6 and 7.

The geometry using two AOMs 106, 108 permits continuous tuning of the QCL (as opposed to discrete tuning in steps). The incident light waves emitted by the laser are deflected by the travelling acoustic gratings created in the AOMs. The angle of the deflection is controlled by the choices of optical and acoustic wavelengths according to equation 1 below:

$$\sin\theta_B = \frac{\lambda_0 v_a}{2nV_a} \qquad \text{Equation 1}$$

where $\theta_B$ is the Bragg diffraction angle, $\lambda_0$ is the free space optical wavelength, n and $V_a$ are the refractive index of and the acoustic velocity in the AO material, respectively, and $v_a$ is acoustic frequency. The direction of the lasing is determined by the laser resonator cavity so the output laser wavelength can be electronically selected by changing the acoustic frequency of the AOM 106, thus changing the Bragg angle condition for the selected wavelength. Deflection efficiency of approximately 90 percent, comparable to that of traditional diffraction gratings, has been demonstrated for LWIR AOMs. The response time of the modulators is determined by the transit time of the acoustic wave across the material 107 and is consistent with high repetition rate measurements. Notice that once the system is aligned, there is no mechanical motion involved for tuning the wavelength of the output. The AOMs 106, 108 are aligned within the cavity and tuning of the output wavelengths is achieved by changing the driving acoustic frequency of the modulators according to Equation 1.

The deflection efficiency depends on modulator radiofrequency (RF) power generated by the radiofrequency generators 125, 126. The higher the RF power, the higher the efficiency, leading to higher feedback strength.

Two possible systems geometries, the one shown in FIG. 6 and another one similar to the Littman-Metcalf geometry for traditional EC QCLs (FIG. 7) are possible, among others. An embodiment of the broadly tunable quantum cascade laser is shown in FIG. 6. The laser comprises a gain medium 102, at least one collimating lens 104, at least one acousto-optic (AO) modulator 106, and at least one highly reflective mirror 110.

In the Littman-Metcalf configuration, the output beam 124 exits from the module through the zero order diffraction of the grating created by the AOM 106. The configuration in FIG. 7 has some advantage over that in FIG. 6. Using the undiffracted beam 120 (or the zero order diffraction beam in the traditional grating nomenclature) has the advantage of using one less collimating lens 104 and associated advantage of reduced effort for aligning two lenses. The removal of one lens also reduces the overall cavity losses, thus will lead to a broader tuning range for the same QCL chip. Therefore, as shown in FIG. 7, a collimating lens at one end can be replaced with a high reflective coating 130 at the gain media 102 of the QCL at that end.

Figure 8:
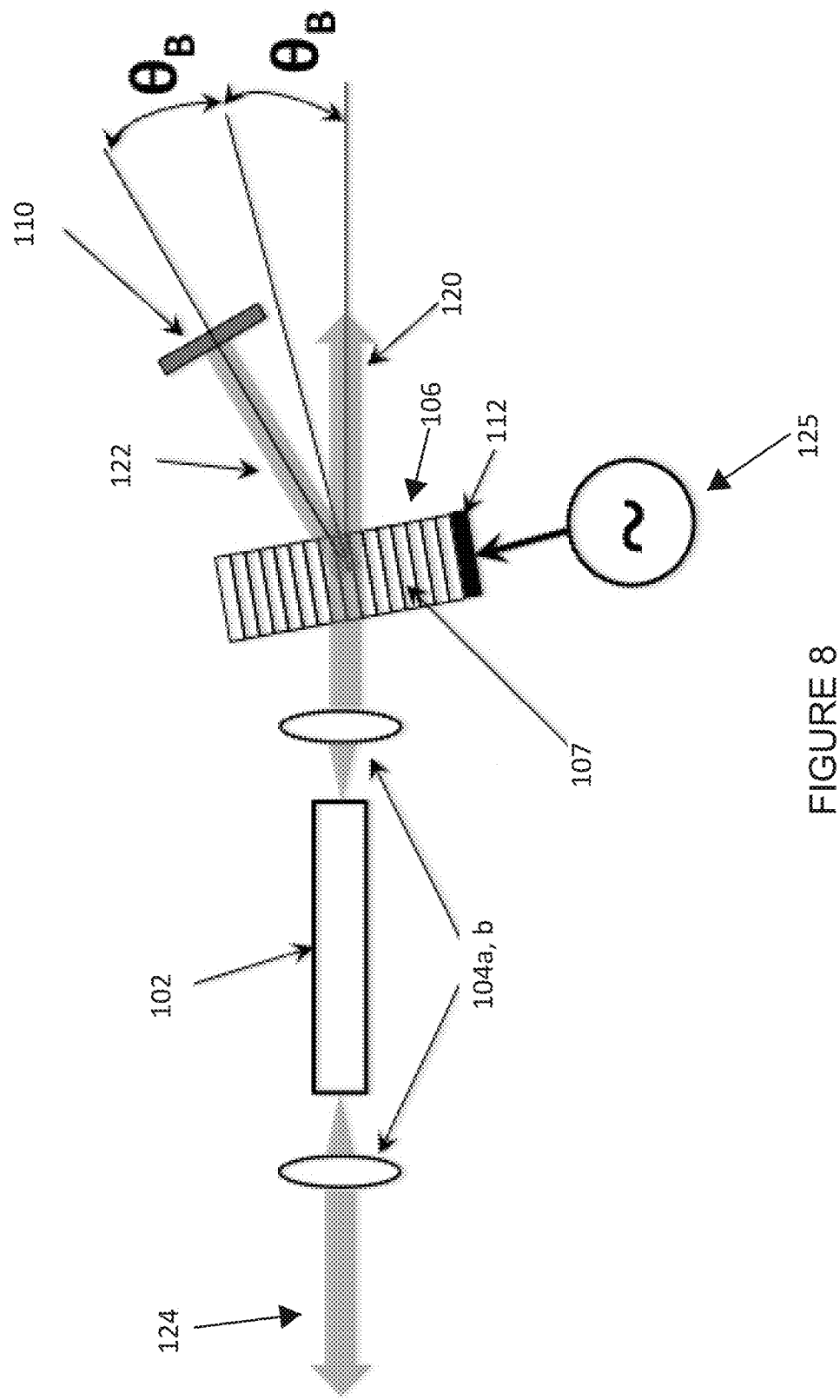
FIG. 8 shows a schematic of an embodiment of a standing wave acousto-optic modulator tuned quantum cascade laser with optical output through zero order diffraction.
Figure 9:
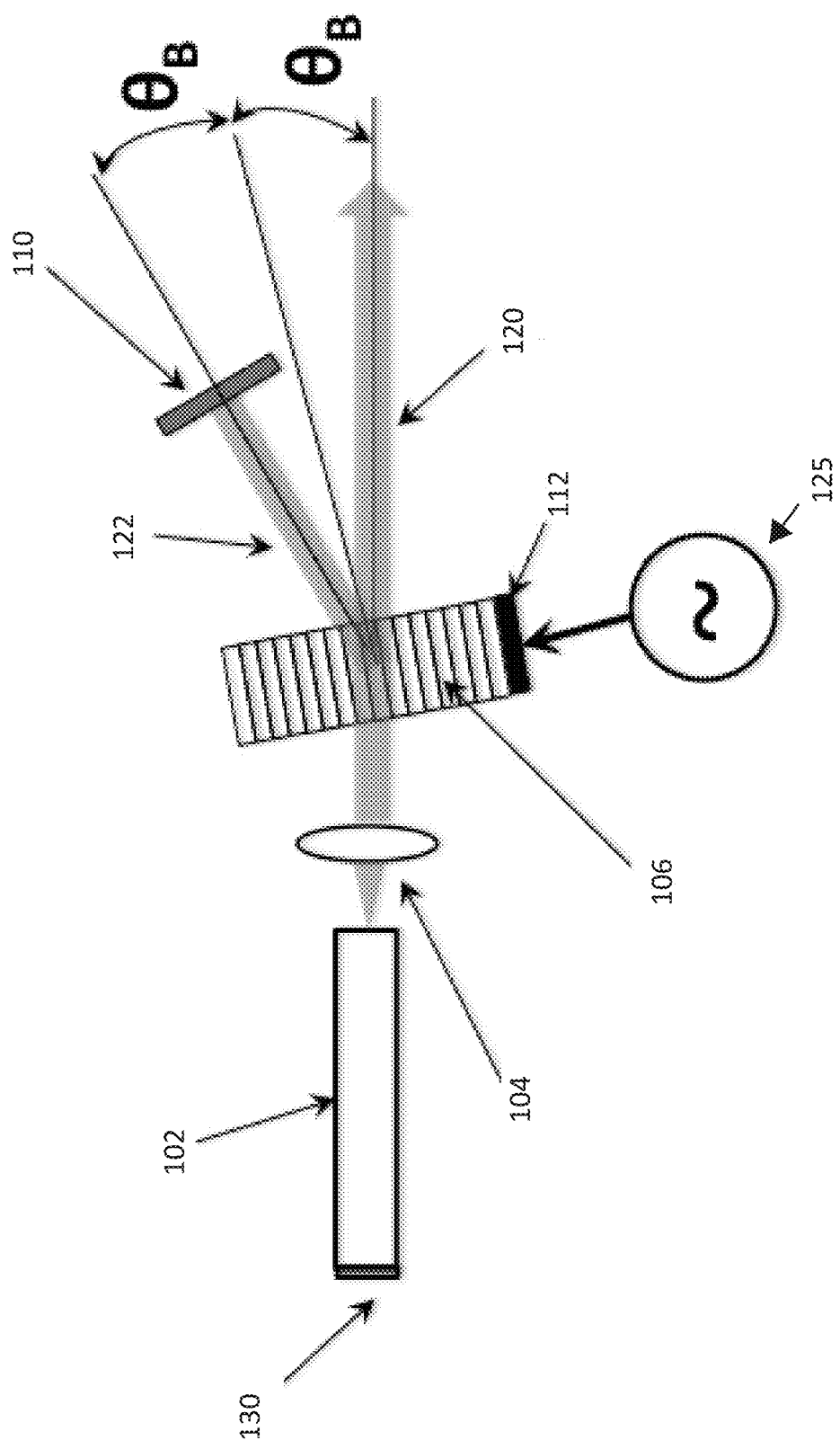
FIG. 9 shows a schematic of another embodiment of a standing wave acousto-optic modulator tuned quantum cascade laser with optical output through zero order diffraction.

Another variation of the configurations shown in FIGS. 6 and 7 is possible if continuous tuning is not required as may be the case when the tunable laser output interacts with a broad spectrum absorber, such as with chemical warfare agents, explosives vapors, and large molecule toxic industrial chemicals. This alternate variation, shown in FIGS. 8 and 9 correspond to the two configurations in FIGS. 6 and 7, respectively. The primary difference arises from the use of a standing acoustic wave (as opposed to the traveling acoustic waves in FIGS. 6 and 7). For example, the acoustic modulator 106 may not have an acoustic absorber 114 at one end. The diffraction of the laser beam from the standing acoustic wave is not accompanied by a Doppler frequency shift in the optical wave and thus a single resonant AOM 106 can be used, leading to substantial simplification of the optical setup and reduction in cost, as well.

Figure 10:
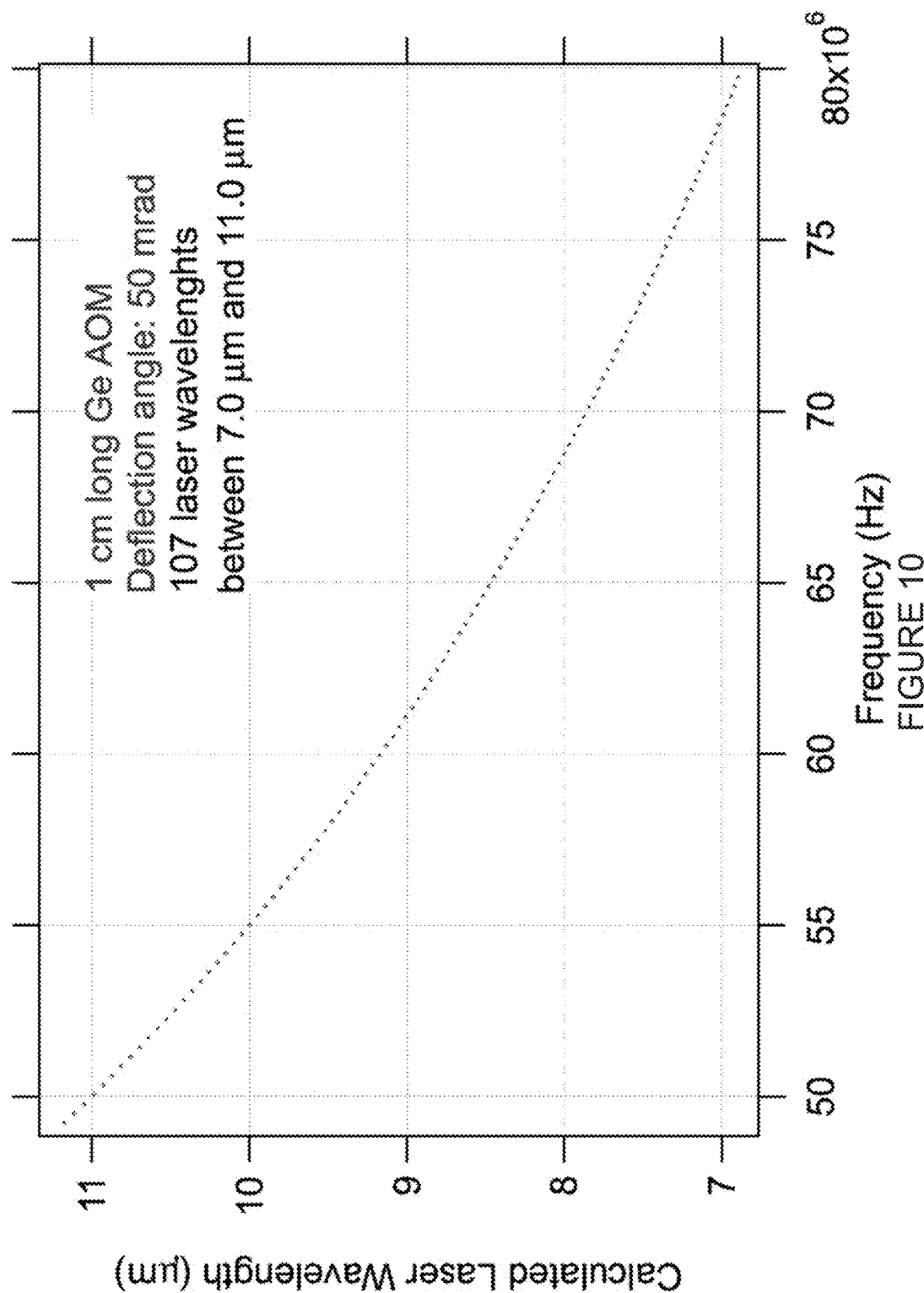
FIG. 10 is a graph showing discreet laser wavelength tuning as a function of acoustic driving frequency for a 1 cm long acousto-optic modulator.
Figure 11:
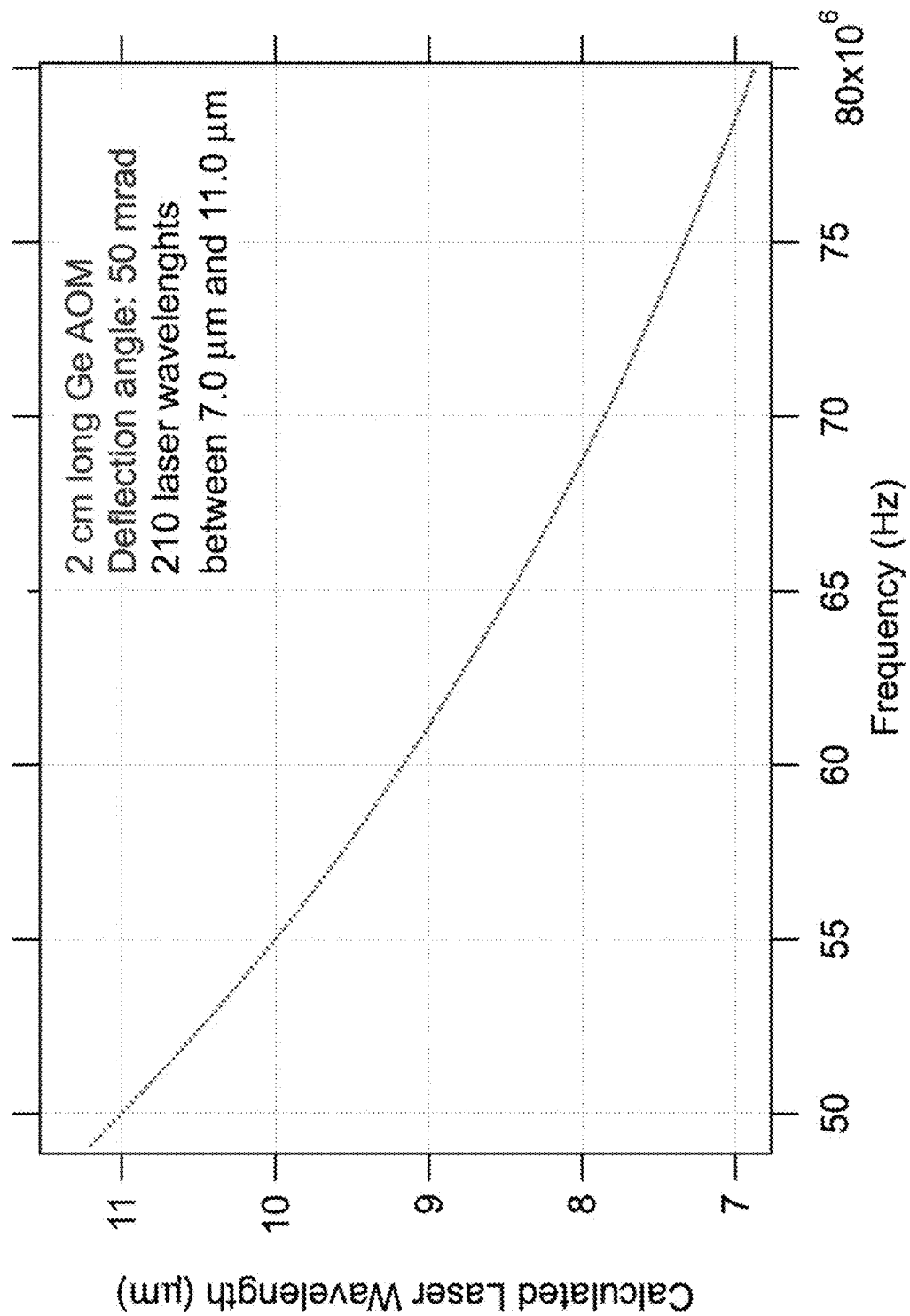
FIG. 11 is a graph showing discreet laser wavelength tuning as a function of acoustic driving frequency for a 2 cm long acousto-optic modulator.

As mentioned above, this configuration does not permit continuous wavelength tuning of the QCL because the standing wave nature of the acoustic grating requires an acoustic resonance in the modulator and thus only discrete acoustic wave frequencies are permitted, determined by the length of the AOM element. The acoustic resonance condition is written as shown in Equation 2 below:

$$N\lambda_{ac} = 2L \quad \text{Equation 2:}$$

where N is the number of acoustic resonances in the AOM 106, $\lambda_{ac}$ is the acoustic wavelength and L is the length of the AOM 106. Thus the discrete permissible acoustic frequencies, $v_{ac}$, for diffraction of the light beam are given by Equation 3 below:

$$v_{ac} = \frac{Nv_{ac}}{2L} \quad \text{Equation 3}$$

where $v_{ac}$ is the acoustic velocity in the AO material 107. FIGS. 10 and 11 show calculated discrete frequencies that are possible in a Ge AOM of 1 cm and 2 cm lengths, respectively.

Thus, for situations where continuous tuning is not required, the standing wave AOM can provide an alternate and simpler solution since even for a 1 cm long AOM, over 100 discrete wavelengths can be obtained.

Overall, the invention has several important advantages, over the grating, prism or filter based EC QCL, for practical field applications. For example, the tuning speed is improved. Typical modulation bandwidth for commercially available AOMs is in the range of tens of MHz. Therefore, the required switching time between arbitrary wavelengths of under 1 microsecond can easily be achieved. This switching time is at least five orders of magnitude faster than that for EC QCLs with a grating.

The flexibility of the wavelength control with AOMs also offers an interesting option of multi wavelengths operation when AOM wave is composed of several discrete frequencies. Each of the sound wave frequencies in this case will force the laser to operate at the corresponding optical frequencies. The multi wavelength operation can be important in spectroscopy when several spectral lines need to be tracked at the same time.

Also, the ruggedness is improved. In contrast to EC QCLs with a grating, wavelength tuning mechanism does not require any mechanical motion. The module can therefore be ruggedized to meet the most stringent requirements for field applications.

In addition, the yield (cost) is improved. The broadly tunable quantum cascade laser comprises a single QCL chip. The standard single-QCL fabrication process has a relatively high yield, exceeding 50 percent for watt-level LWIR devices. In case of QCL arrays, yield, however, quickly drops with increase in number of elements. For comparison, even a 10-element array processed from the same material would have a yield of less than 1 percent. Number of elements in a DFB QCL array required to cover the 7 to 11 micrometer tuning region can be as high as one hundred. As a consequence, DFB QCL arrays are projected to have a very low yield, making this technical approach impractical.

With regards to epi-down mounting, the present invention is compatible with QCL epi-down mounting that is now commonly employed to lower active region temperature of high average power devices. QCL arrays, on the other hand, are typically mounted epi-up to preserve individual electrical control for each of the emitters in the array. Overheating of the epi-up mounted array will make the goal of reaching high average optical power significantly more difficult, or even impossible.

With regards to reliability, all of the components in the proposed module have been in commercial use for some time and have proven their long-term reliability. The high power FP QCLs have been in commercial production for nearly a decade and the AOMs have been commercially deployed for several decades. Thus, the two critical components in the proposed configuration, namely FP QCLs and AOMs, represent mature technologies.

AOMs have been successfully used for rapid and random access discreet tuning of $CO_2$ lasers on their 9.6 micrometer and 10.6 micrometer laser bands and continuous tuning of Ti: sapphire lasers. Research also provides earlier data on tuning of dye lasers using acousto-optic modulators. However, because of the only recent development of QCLs, acousto-optic tuning of QCLs has not been attempted.

This technology may be applicable to the interband cascade lasers as well.

EXAMPLES

Reported is the first operation of tunable external cavity quantum cascade lasers with emission wavelength controlled by an AOM. A long-wave infrared quantum cascade laser wavelength is tuned from approximately 8.5 micrometer to approximately 9.8 micrometer when the AOM frequency is changed from 41 MHz to 49 MHz. The laser delivered over 350 mW of average power in the center of the tuning curve in a linewidth of 4.7 $cm^{-1}$. Measured wavelength switching time from the edge of the tuning curve to the center of the tuning curve is less than 1 microsecond. Initial spectral measurements of infrared absorption features of gaseous isopropyl alcohol were carried out, which demonstrate a capability of obtaining complete spectral data from approximately 8.5 micrometer to approximately 9.8 micrometer in less than 20 microseconds. The demonstration paves a way for a new generation of tunable QCLs providing ruggedness, fast tuning and high power capability in the infrared spectral region.

Figure 12:
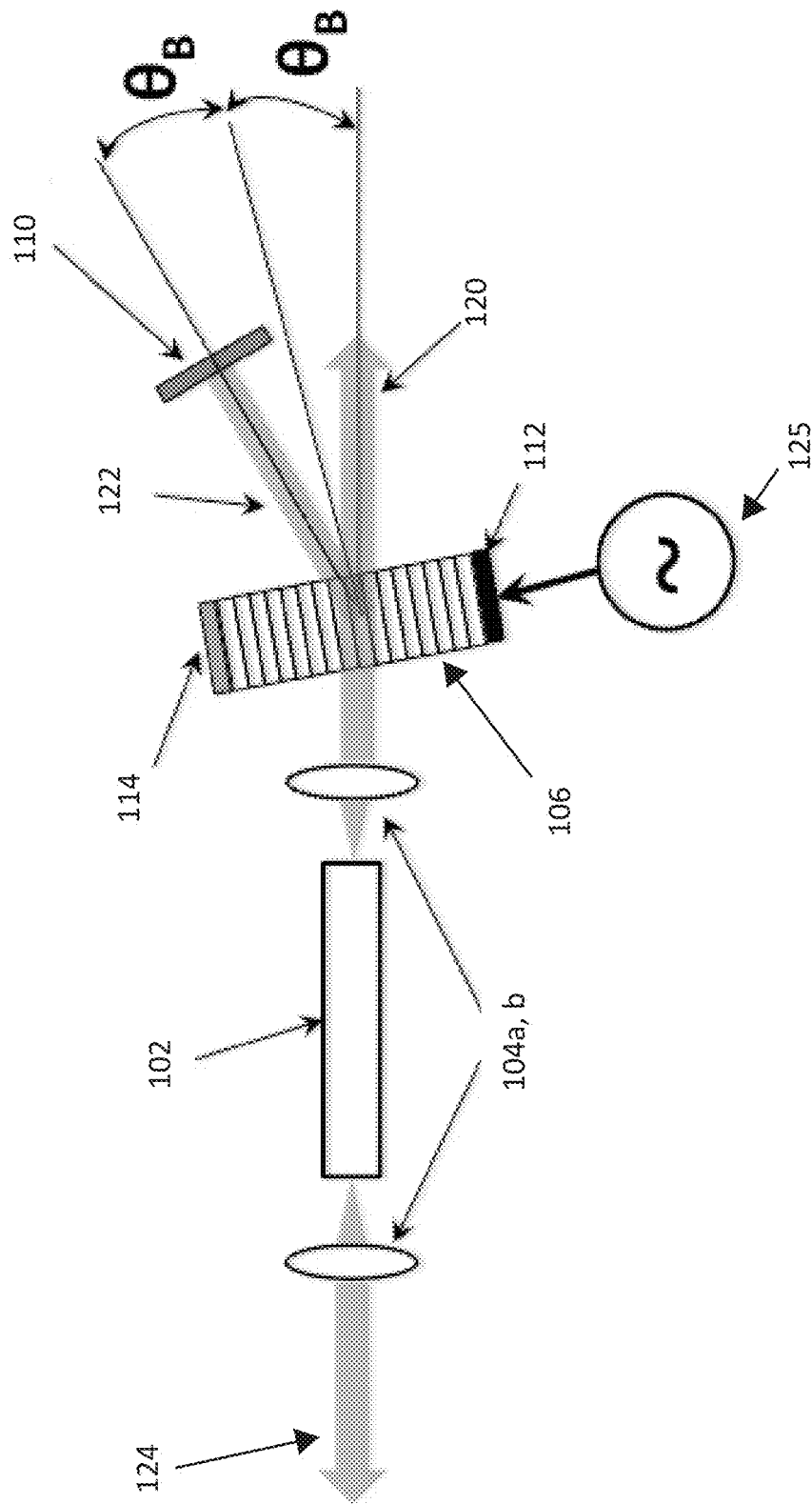
FIG. 12 shows a schematic of an embodiment of a traveling wave acousto-optic modulator tuned quantum cascade laser (Littrow configuration).

The AOM 106 tuned QCL configuration is shown in FIG. 12. The piezoelectric transducer 112 of the AOM creates a traveling acoustic wave in the germanium crystal. The sound wave, in turn, produces a spatial periodic variation in refractive index of the crystal, i.e. it creates a phase grating. The undiffracted optical beam 120 incident on the AOM 106 experiences a wavelength dependent deflection. The diffracted beam 122 subsequently reflects back from the mirror 110 to the AOM 106 and couples back into the gain medium 102, completing the wavelength-dependent feedback loop. The output optical beam 124 from the gain medium 102 emerges from the other side of the laser.

The period of the acoustic grating is electronically controlled, which allows for the rapid change of the diffracted wavelength. Typical modulation bandwidth for commercially available AOMs is in the range of tens of MHz. Hence, the required switching time, between arbitrary wavelengths, of under 1 microsecond can be achieved. This switching time is at least five orders of magnitude faster than that for EC QCLs with a grating. In addition, in contrast to EC QCLs with a grating, wavelength tuning mechanism does not require any mechanical motion. The module can therefore be ruggedized to meet the most stringent requirements for field applications.

Figure 13:
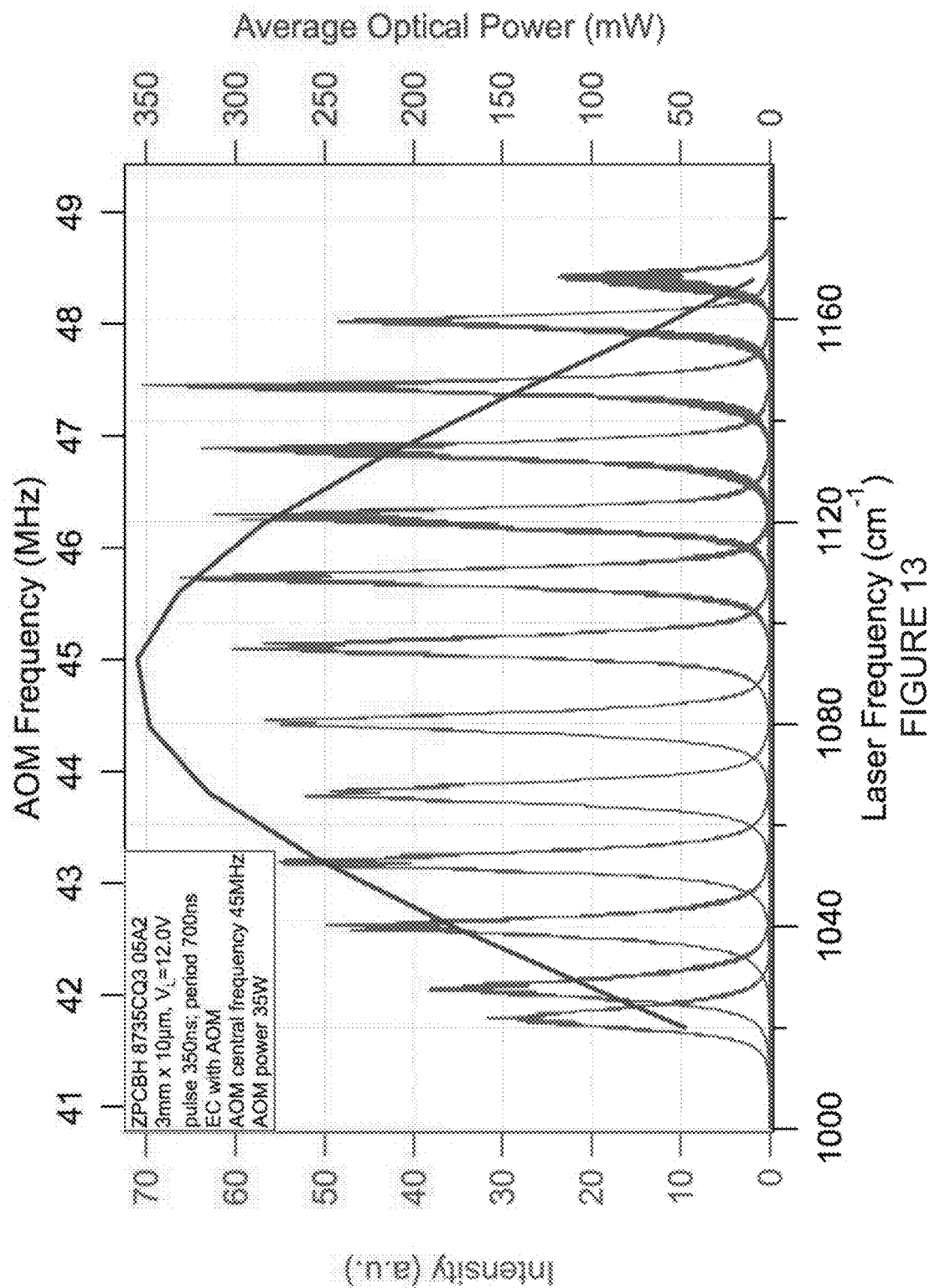
FIG. 13 shows a graph of a tuning curve for the acousto-optic modulator-controlled external cavity quantum cascade laser (EC QCL) setup.

The frequency of the AOM used in this example was adjustable in the range from 35 MHz to 55 MHz. FIG. 13 shows a measured tuning curve for a 9 micrometer QCL, with the QCL design described in A. Lyakh, R. Maulini, A. Tsekoun, R. Go, and C. K. N. Patel, "Multiwatt long wavelength quantum cascade lasers based on high strain composition with 70% injection efficiency", Opt. Expr. 22, 24272 (2012) (which is incorporated here by this reference), operating in a quasi-CW mode (350 nanosecond pulses and 50 percent duty cycle) as AOM frequency was changed from 41.7 MHz to 48.5 MHz (approximately ⅓ of the available frequency range). AOM input power was fixed at 35 W during the testing. The emission wavelength for the EC laser tuned from 1020 cm$^{-1}$ (9.8 micrometer) to 1170 cm$^{-1}$ (8.5 micrometer). The tuning range available from a single laser can be increased using broader gain QCL chips.

Measured QCL emission spectrum linewidth for AOM central frequency of 45 MHz was 4.7 cm$^{-1}$. The linewidth can be changed by aligning the system so that it operates at another AOM central frequency (different Bragg condition). Employment of a higher AOM frequency will result into a larger number of illuminated acoustic grating periods and, therefore, to a proportionately narrower linewidth. This effect is illustrated in FIGS. 14 and 15. The increase in the central AOM frequency from 35 MHz to 55 MHz leads to a reduction in emission linewidth from 5.7 cm$^{-1}$ to 3.9 cm$^{-1}$.

The response time of the change in the optical wavelength with a change in the AOM frequency has two components: (1) propagation time of the acoustic wave from the acoustic transducer to the edge of the optical beam going through the AOM, and (2) the propagation time for the acoustic wave across the optical beam. The first "delay" is the latency time and does not represent the response time of the change the optical wavelength when AOM frequency is changed. The latency time can be shortened, almost arbitrarily, by reducing the distance between the acoustic transducer and the position of the optical beam. The actual response time, therefore, is determined by the acoustic wave transit time across the optical beam. For the present case, the time it takes an acoustic wave to propagate from the piezoelectric transducer across the germanium material to the edge of the optical beam is $t_1$ and time for the acoustic wave to cross the optical beam is $t_2$. The time $t_2$ is the actual response time of the AOM for changing the optical wavelength. As mentioned above, $t_1$ can be shortened to almost zero. However, there are limitations on how short $t_2$ can be. If $t_2$ is made too short by making the optical beam diameter small, the optical wave will interact with a fewer number of acoustic waves and therefore the linewidth of the output will increase. The linewidth of the optical output can be reduced by making the optical beam diameter larger, but that occurs at the expense of the response time. The optimal linewidth/response time balance is application driven.

Figure 14A:
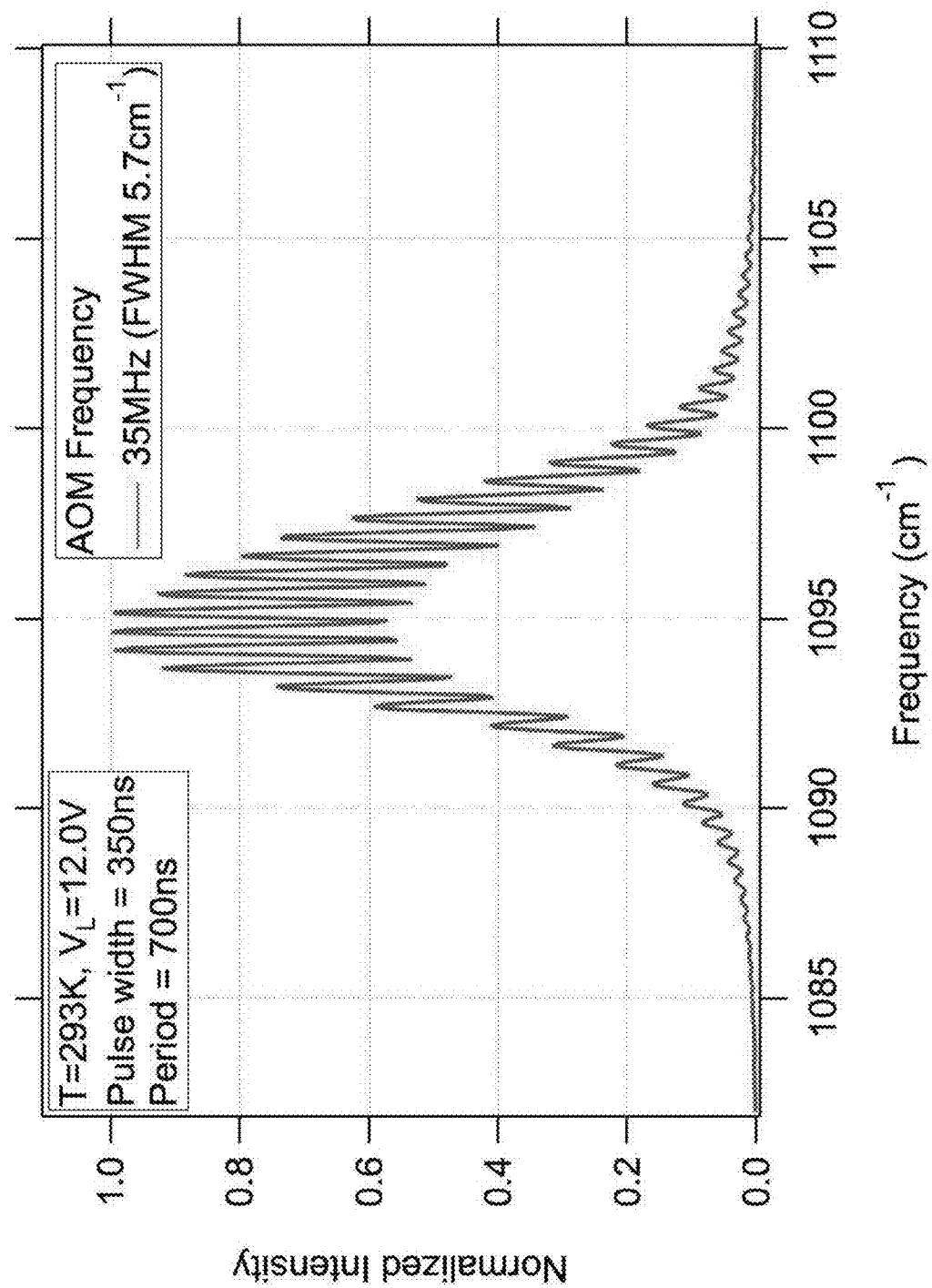
FIGS. 14A-C show measured output spectra for the same QCL output wavelength at three different acousto-optic modulator frequencies.
Figure 14B:
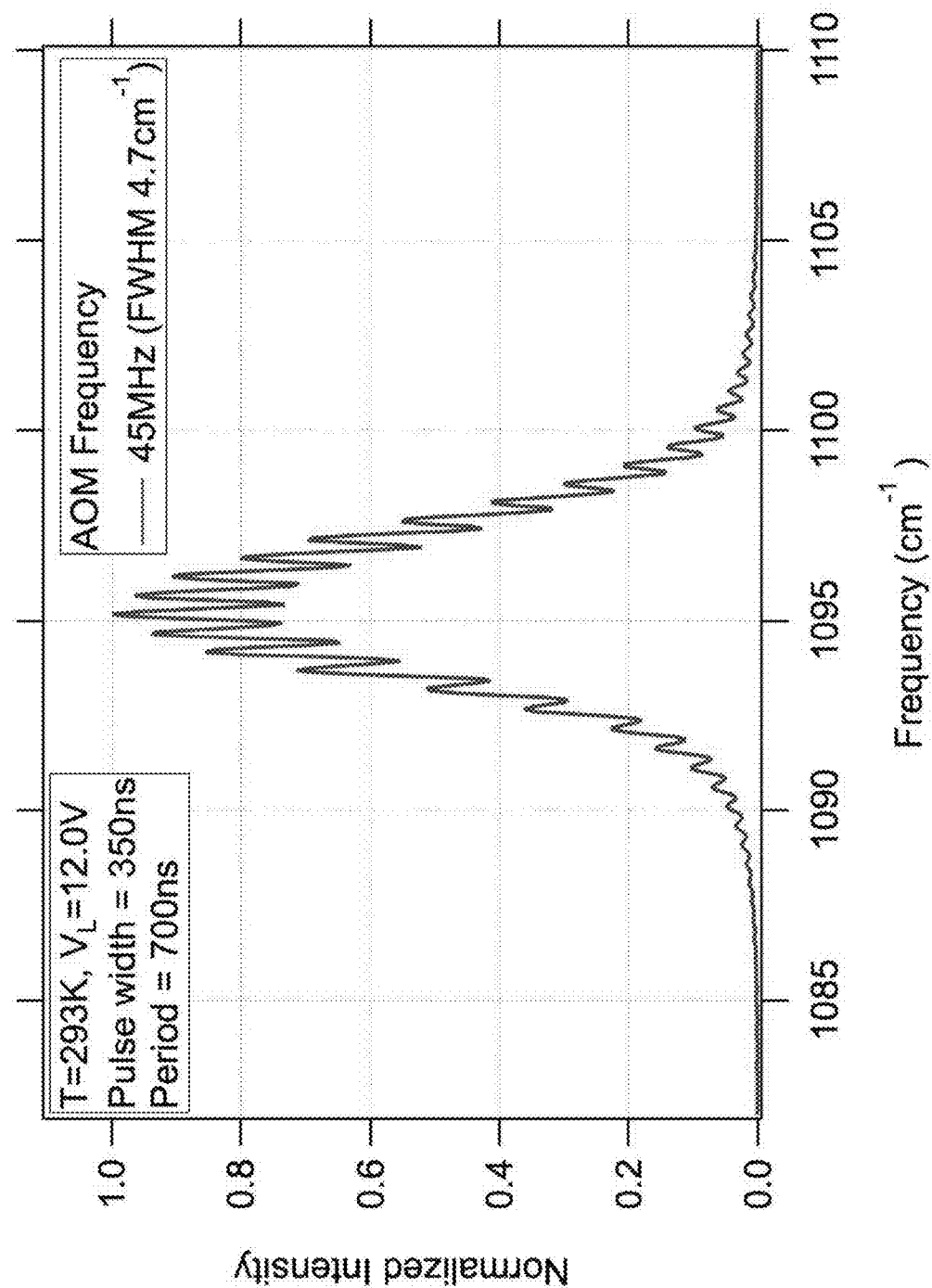
Figure 14C:
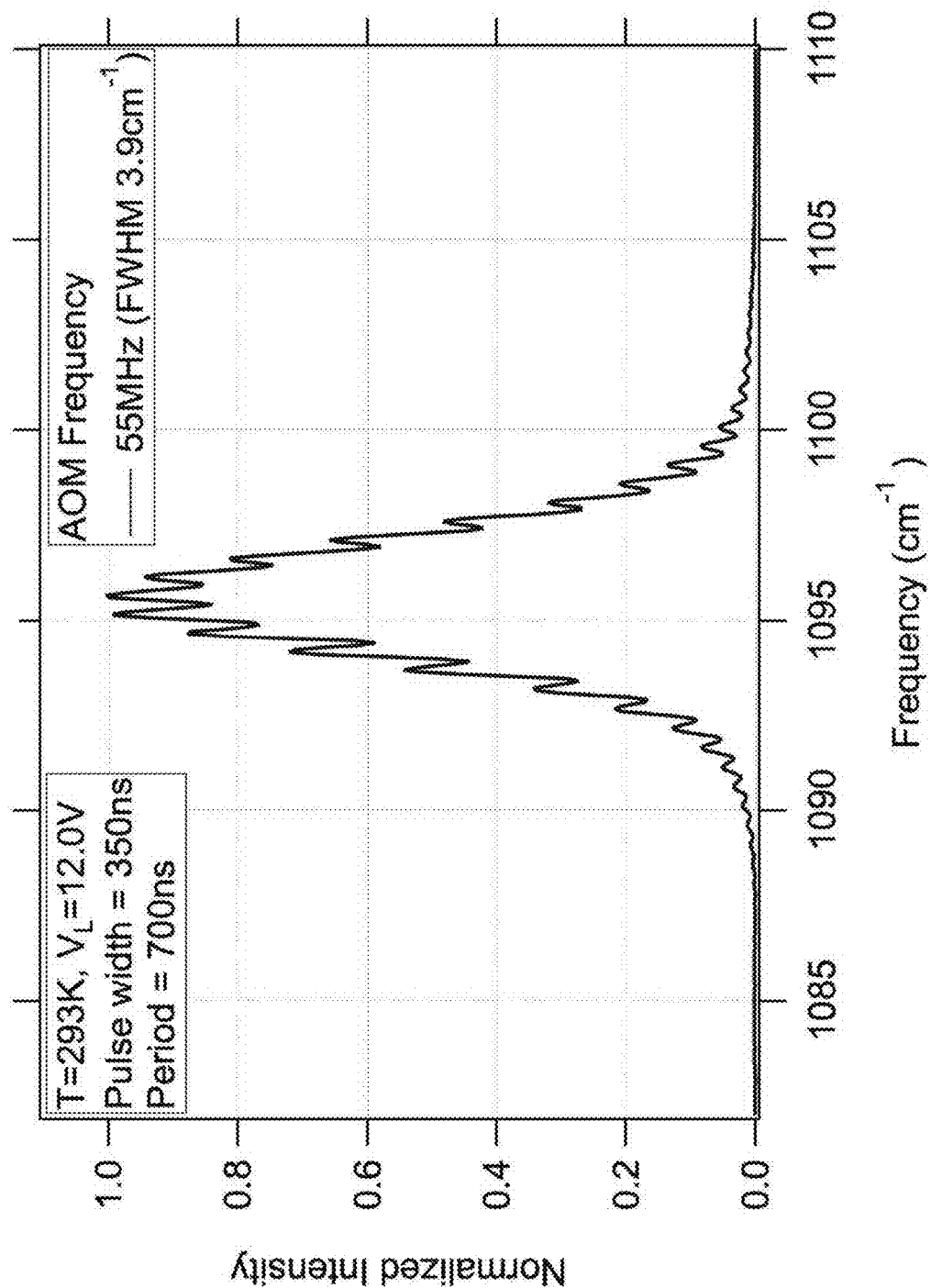
Figure 14D:
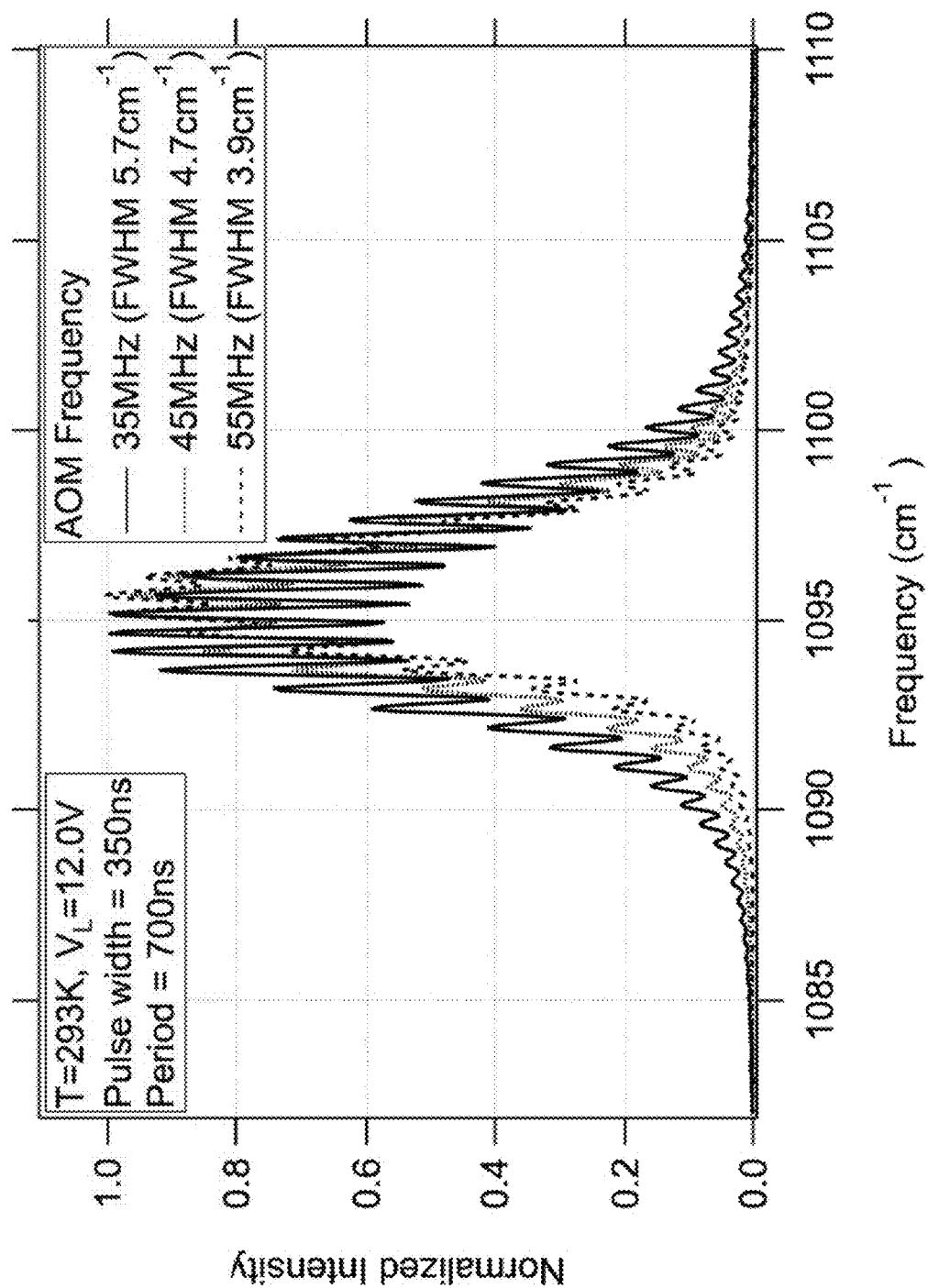
FIG. 14D shows measured output spectra from FIGS. 14A-C overlapped onto a single graph for comparison.
Figure 16A:
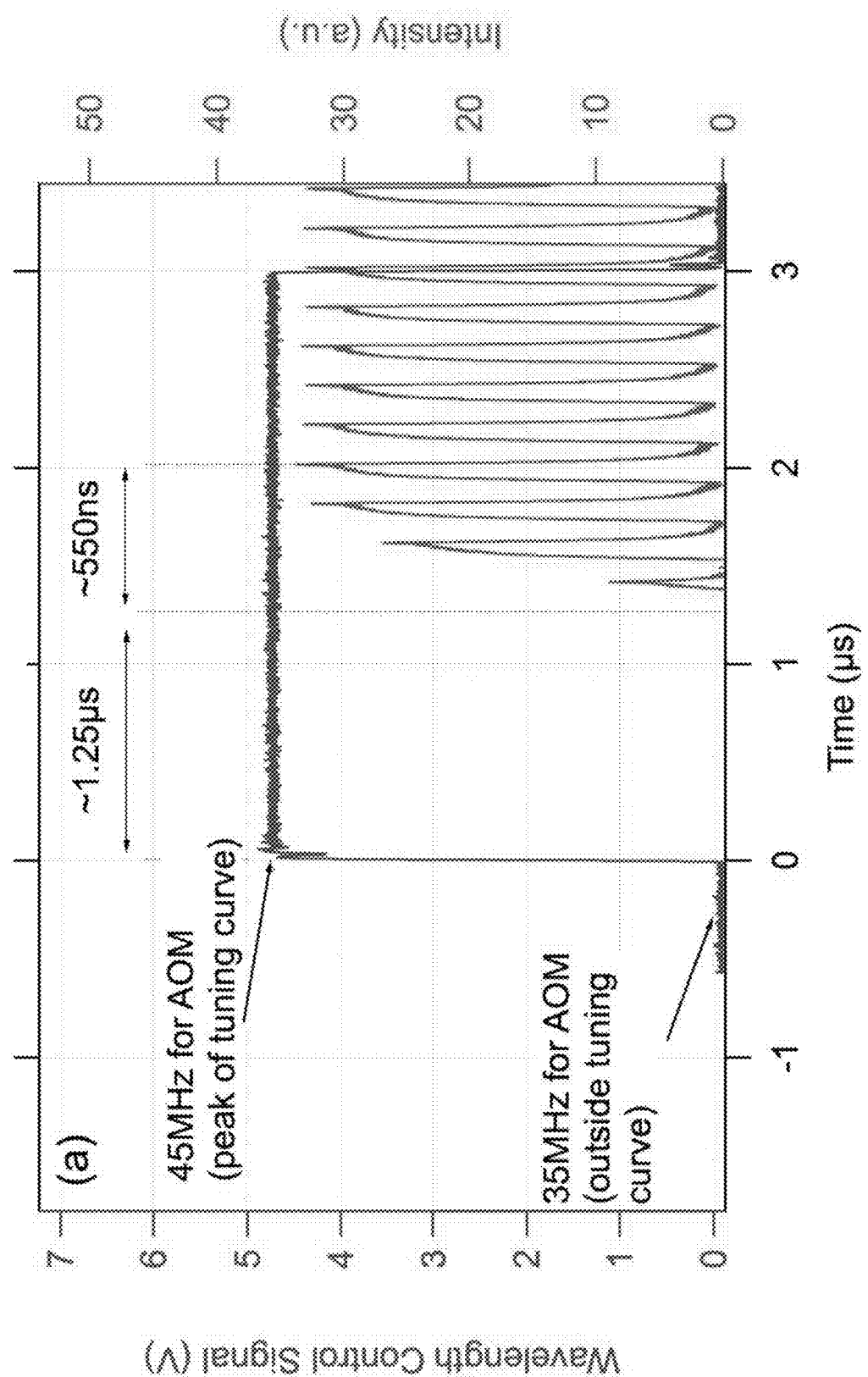
FIGS. 16A-B show switching time data for the acousto-optic modulator-controlled EC QCL setup.
Figure 16B:
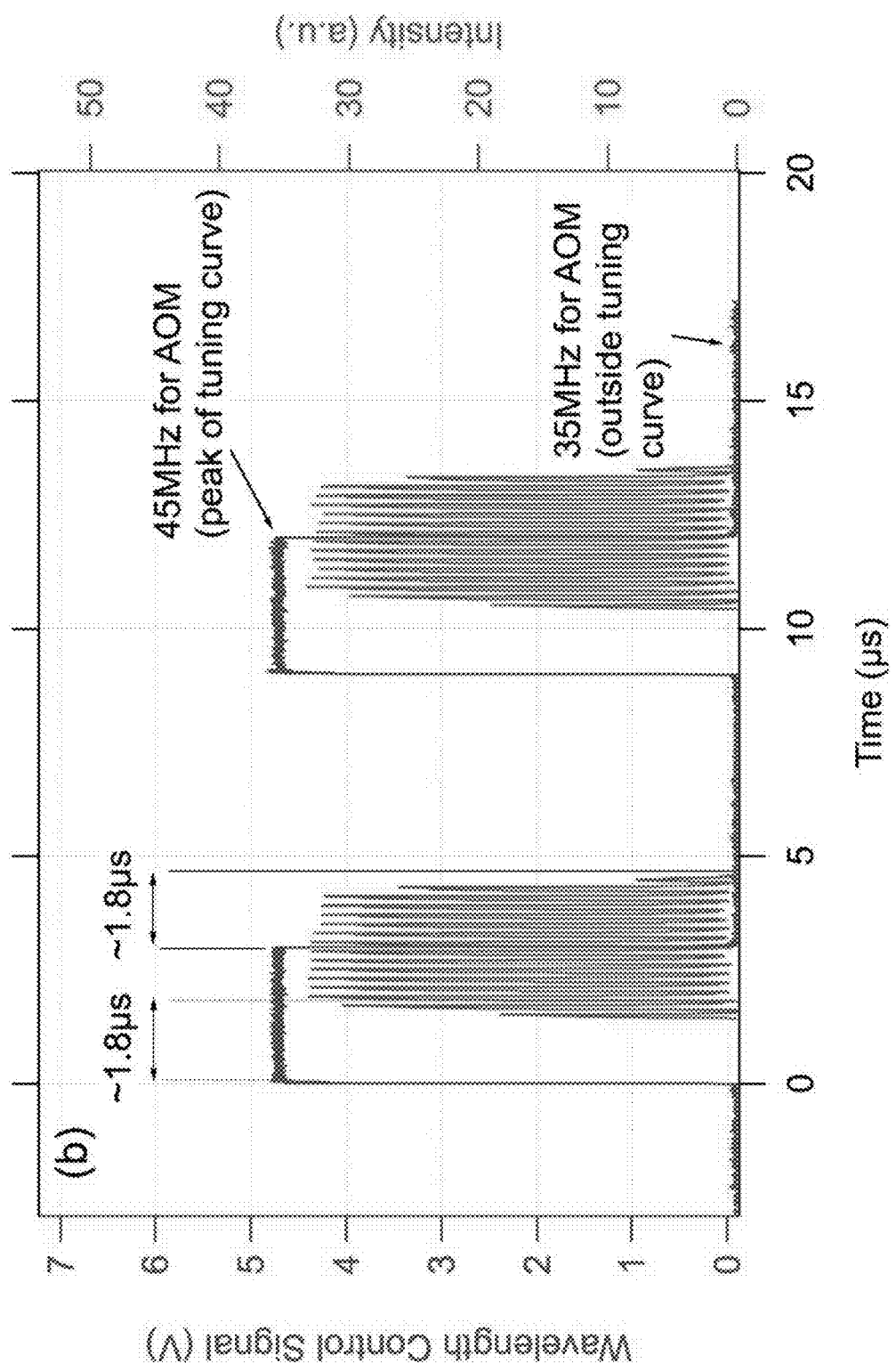

FIGS. 16A and 16B show measured response time of the system as AOM frequency switches from 35 MHz (outside of the tuning curve) to 45 MHz (center of the tuning curve). FIG. 14B shows the AOM frequency control signal and FIG. 14A shows the optical signal from the laser, which consists of pulses of duration 350 nanosecond pulses with a pulse repetition period of approximately 700 nanoseconds.

AOM frequency is initially equal to 35 MHz, outside of the tuning curve of the laser. The optical signal from the laser is at zero level since the Bragg condition is not satisfied anywhere in the laser gain spectrum. AOM frequency is abruptly changed to 45 MHz at time t=0. AOM frequency of 45 MHz corresponds to the peak of the gain curve. It takes approximately $t_1=L/v_s=1.25$ microseconds for the acoustic signal with the new frequency to reach the area where the optical beam is incident on the crystal ($v_s$ is sound velocity and L is defined in FIG. 17). When the sound signal with the new frequency reaches that area, the optical signal starts growing. It reaches its maximum value at $t_2=550$ nanoseconds+$t_1$, in a good agreement with the calculated travelling time across the beam area $t_2=D_B/v_s=3.4$ millimeter/(5.5 millimeter/microsecond) approximately 600 nanoseconds (FIG. 16A). The AOM frequency switches back to 35 MHz at t=3 microseconds. The process is repeated: it takes about $t_1+t_2=1.8$ microseconds for the laser to completely shut down (FIG. 16B).

Figure 17:
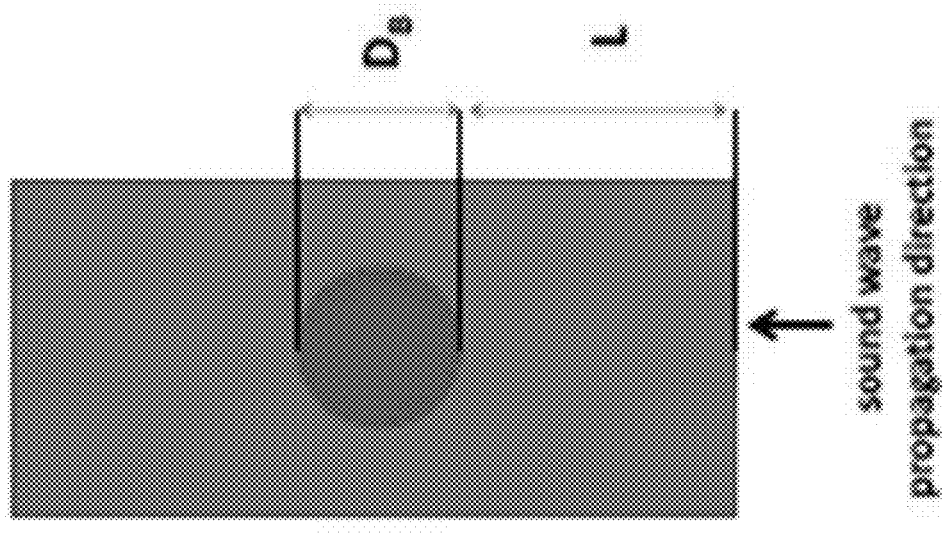
FIG. 17 shows a schematic defining the beam size $D_B$ and sound wave propagation length to the beam L.

As mentioned above, the latency time $t_1$ is proportional to L and can be almost arbitrarily minimized by designing the AOM so that the piezoelectric transducer generating the sound wave is positioned closer to the beam area (L in FIG. 17 as short as possible). Time $t_2$, on the other hand, is fixed for the same choice of material and beam size. It is, however, already well below 1 microsecond. Thus, if the AOM frequency was changed between two values, for example, $f_1$ and $f_2$, the laser wavelength will switch between two corresponding values in a time less than 1 microsecond, the latency time notwithstanding.

Figure 18:
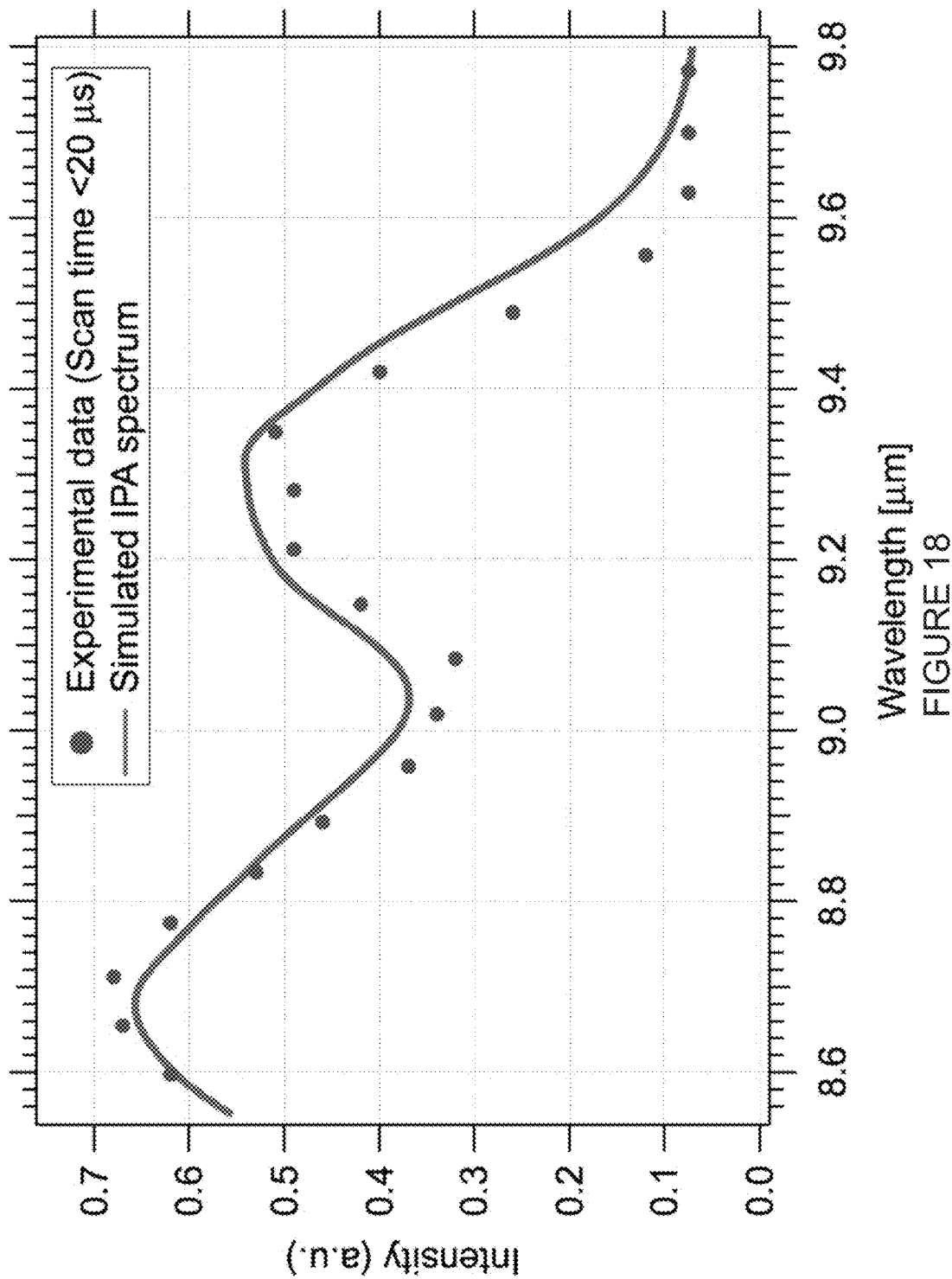
FIG. 18 shows a graph of simulated vs. experimental data for IPA absorption.

To demonstrate the rapid spectral measurement capability for the AOM-controlled EC QCLs, a transmission absorption spectrum of isopropyl alcohol vapor that has a broad infrared absorption spectrum. The measurement was done in the sweep mode when acousto-optic frequency was varied from 42 MHz to 48 MHz. FIG. 18 shows the comparison between an IPA spectrum generated using the HITRAN database and collected experimental data. The experimental data were captured in a single AOM frequency sweep from 42 MHz to 48 MHz that took less than 20 microseconds.

In conclusion, the first data for AOM-controlled external cavity QCLs is presented. These devices offer the advantage of very fast tuning capability with spectral measurement time of under 20 microseconds. The configuration does not involve any moving parts and therefore can be ruggedized for demanding field applications.

Figure 19:
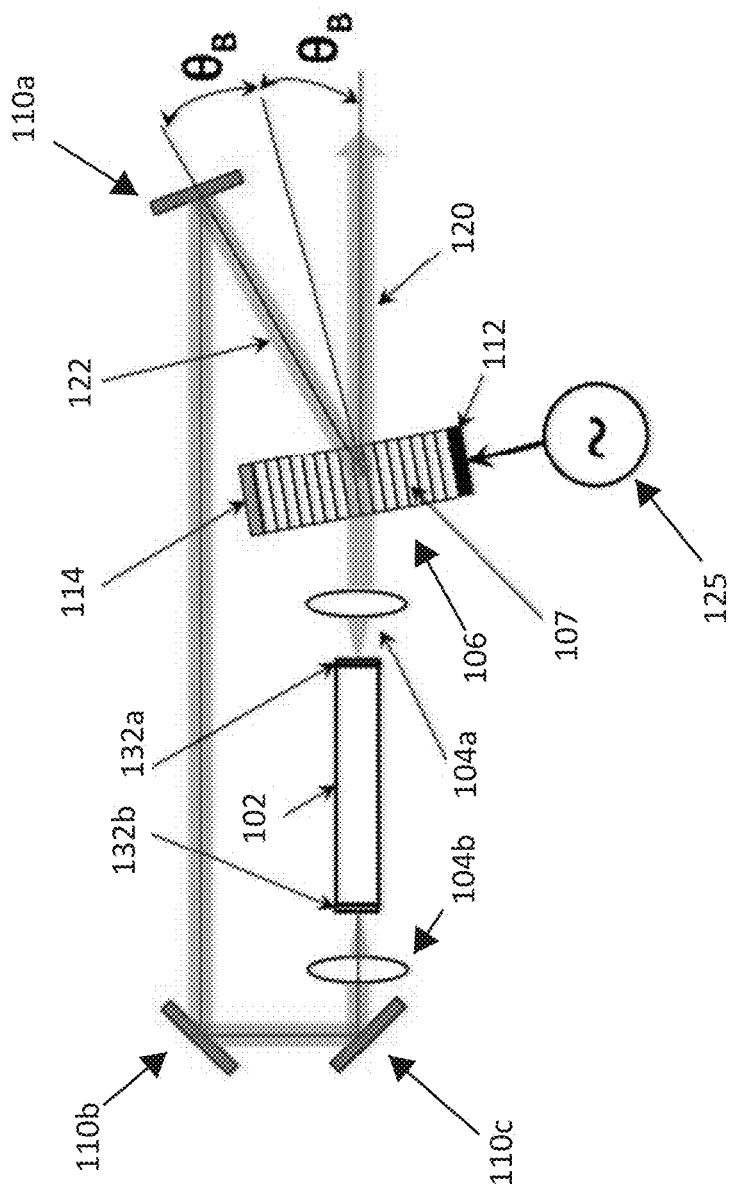
FIG. 19 shows a schematic of an embodiment of a ring laser utilizing an acousto-optic modulator.
Figure 20:
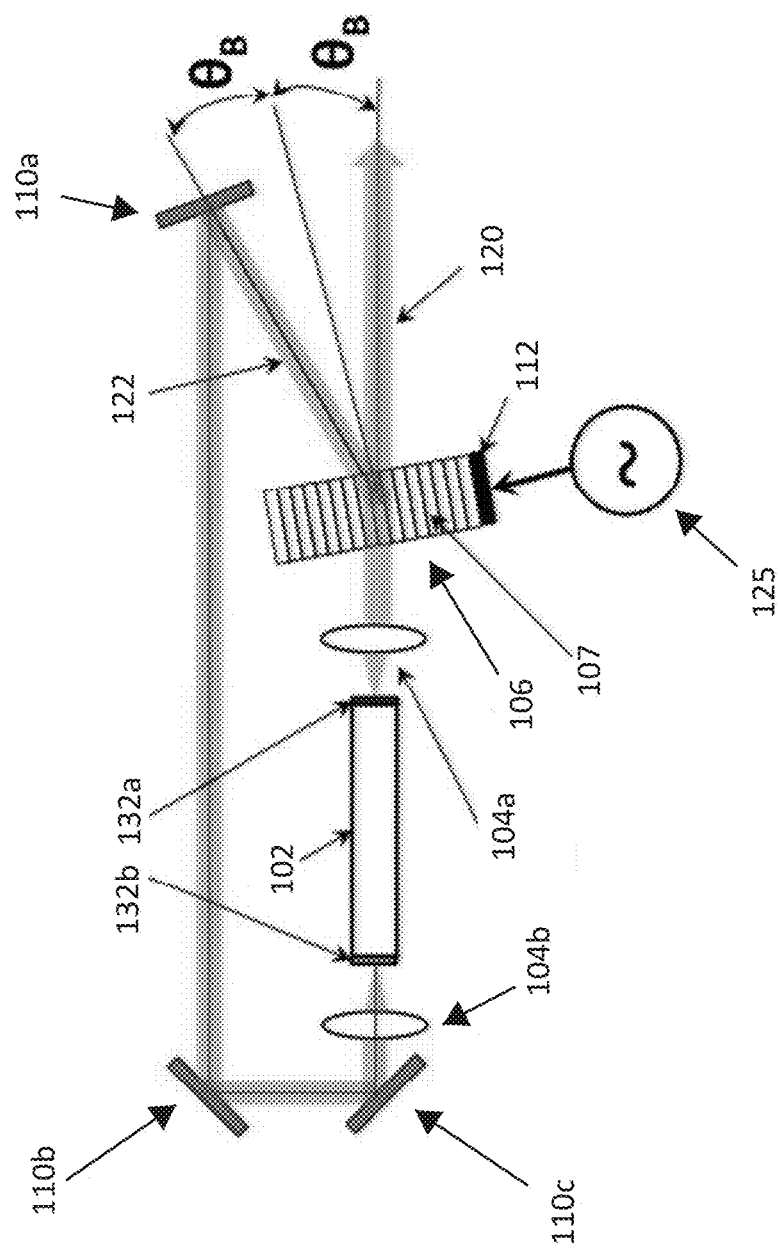
FIG. 20 shows a schematic of another embodiment of a ring laser utilizing an acousto-optic modulator.
Figure 21:
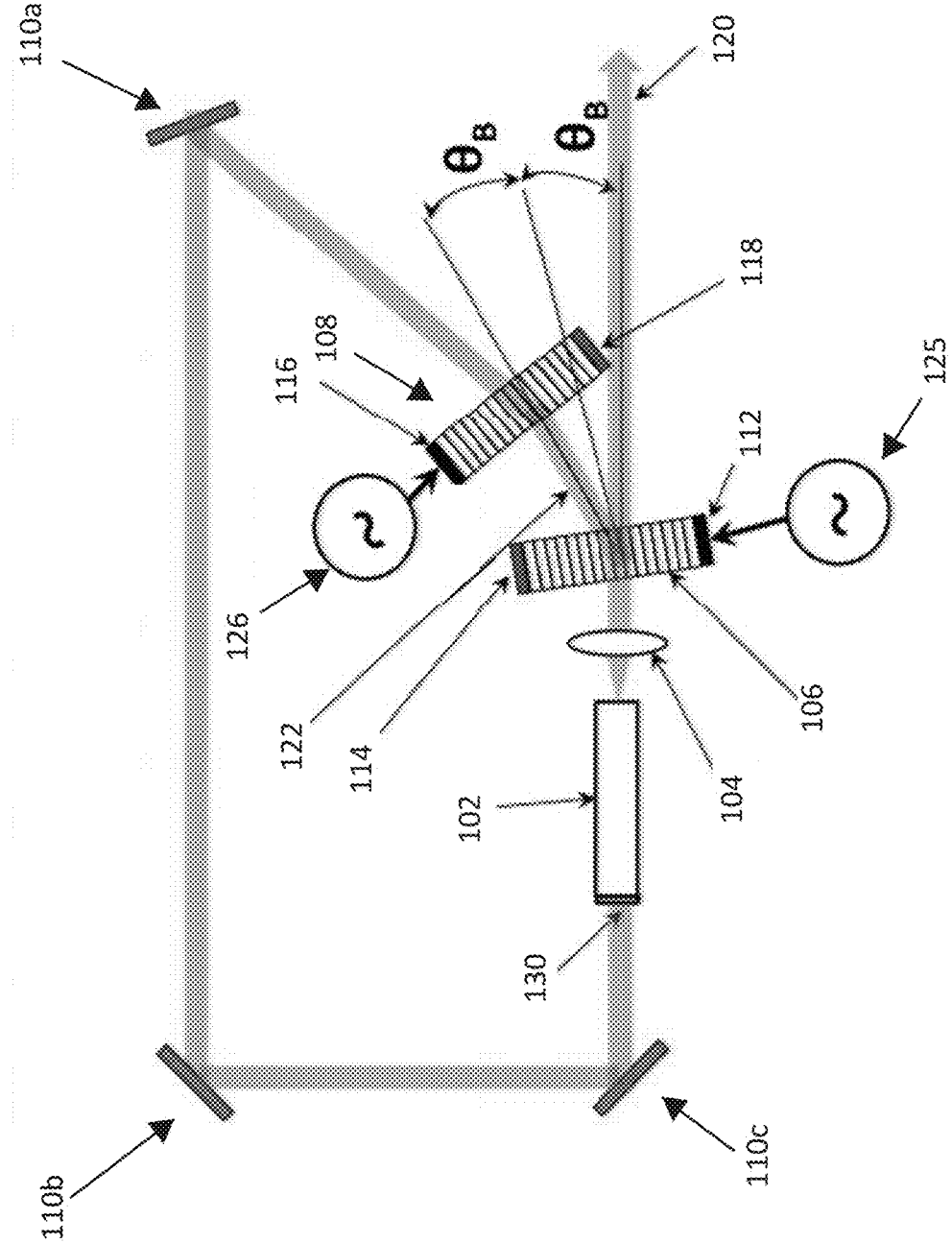
FIG. 21 shows a schematic of another embodiment of a ring laser utilizing an acousto-optic modulator.

The present invention may also be applied to ring laser geometry as shown in FIGS. 19-21. The ring laser configuration has been extensively studied in the near infrared lasers. Compared to traditional standing wave cavity lasers, described in other parts of this patent application, ring cavity lasers can operate in either of the counter propagating directions or both. This capability offers advantages including the capability of unidirectional laser oscillation with at least the following advantages: (1) ring laser operating in a unidirectional mode, eliminates the spatial hole burning effect present in traditional cavity lasers and extracts power from the gain medium uniformly, making it homogeneous, which increases mode competition between adjacent longitudinal modes and affords the possibility of single mode operation even at high power outputs; (2) uniform extraction of power without spatial hole burning results in higher single mode power output compared to that possible with standing wave configuration; (3) ring cavity operation is less sensitive to small misalignments; and (4) ring cavity laser operated in a unidirectional mode can be less sensitive to optical feedback from external elements.

As shown in FIGS. 19 and 20, the ring laser geometry may comprise the gain medium 102 of the laser having anti-reflection coatings 132a, b at opposite ends of the gain medium 102, a pair of collimating lenses 104, an AOM 106 powered by a radiofrequency generator 125, and a plurality of highly reflective mirrors 110a-c. The highly reflective mirrors are positioned so that one mirror 110a receives the diffracted beam 122 from the AOM 106 and deflects the diffracted beam 122 to the second mirror 110b positioned on the opposite side of the gain medium 102, which in turn deflects the diffracted beam 122 to the third mirror 110c, which deflects the diffracted beam 122 through one of the collimating lenses 104 and back to the gain medium 102. In some embodiments, the AOM 106 may have an acoustic absorber 114 opposite the piezoelectric transducer 112 so as to generate a traveling acoustic wave through the material 107 (FIG. 19). In other embodiments, the AOM 106 may not have the acoustic absorber so as to create a standing wave (FIG. 20).

In some embodiments, as shown in FIG. 21, the laser may only have a high reflective coating 130 at one end of the gain medium 102 and only one collimating lens 104 at the opposite end of the gain medium 102. The beam is emitted from one end of the gain medium 102 and passes through the AOM 106. The beam is diffracted through the AOM 106 and is directed to the first mirror 110a. Through a series of deflections off of the other mirrors 110b, 110c, the diffracted beam 122 returns to the laser at the opposite end having the high reflective coating.

In embodiments utilizing travelling waves, a second AOM 108 may be used in the opposite orientation relative to the first AOM 106 so that the travelling waves from each AOM 106, 108 travel in opposite directions so that the Doppler shift in the frequency of the diffracted laser beam created in the first AOM 106 is cancelled out by the complimentary Doppler shift introduced by the second AOM 108.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims and the equivalents to the claims appended hereto.

What is claimed is:

1. An infrared quantum cascade laser, comprising:
   a. a quantum cascade laser gain medium having a first end and a second end;
   b. a first collimating lens adjacent to the first end of the slain medium and receiving an undiffracted output beam from the gain medium defining a first path;
   c. an anti-reflection coating at the first end of the gain medium, the anti-reflection coating facing the first collimating lens;
   d. a first acousto-optic modulator adjacent to the first collimating lens and opposite the gain medium and fixed in place, the first acousto-optic modulator having a first radiofrequency and receiving the undiffracted output beam and subsequently emitting a diffracted beam;
   e. a second acousto-optic modulator through which the diffracted beam passes, the second acousto-optic modulator having a secondary radiofrequency; and
   f. a first highly reflective mirror positioned to receive the diffracted beam from the second acousto-optic modulator, and reflect the diffracted beam back to the second acousto-optic modulator to the first acousto-optic modulator and back to the gain medium to amplify a wavelength tuned output beam, wherein the first and second radiofrequencies of the first acousto-optic modulator and the second acousto-optic modulator, respectively, are electronically controlled to produce the diffracted beam at a desired optical wavelength,
   g. wherein the first acousto-optic modulator comprises:
      i. a first transparent material having a first end and a second end opposite the first end, the first transparent material having anti-reflection coating at the desired optical wavelength; and
      ii. a first piezoelectric transducer at the first end of the first transparent material, the first piezoelectric transducer being controlled by a first radiofrequency generator, wherein the first acousto-optic modulator has discrete acoustic frequencies, v, characterized by the equation $v=(NV)/2L$, where N is a number of acoustic resonances, V is an acoustic velocity, and L is a length of the first acousto-optic modulator, and
   h. wherein the second acousto-optic modulator comprises:
      i. a second transparent material having a first end and a second end opposite the first end, the second transparent material having anti-reflection coatings at the desired optical wavelength; and
      ii. a second piezoelectric transducer at the first end of the second transparent material, the second piezoelectric transducer being controlled by a second radiofrequency generator,
      iii. wherein the first acousto-optic modulator is oriented oppositely compared to the second acousto-optic modulator so that the second acousto-optic modulator cancels out a Doppler shift of an optical radiation caused by the first acousto-optic modulator.

2. A quantum cascade laser, comprising:
   a. quantum cascade laser gain medium having a first end and a second end:
   b. a first collimating lens adjacent to the first end of the gain medium and receiving an undiffracted output beam from the gain medium defining a first path;
   c. a highly reflective coating at the second end of the gain medium, and an anti-reflection coating at the first end of the gain medium, facing the first collimating lens;
   d. a first acousto-optic modulator adjacent to the collimating lens and opposite the gain medium and fixed in place, the first acousto-optic modulator receiving the undiffracted output beam directly from the collimating lens and subsequently emitting a diffracted beam along a second path:
   e. a first highly reflective mirror positioned to receive the diffracted beam and reflect the diffracted beam back along the second path to the first acousto-optic modulator through the first path and back to the gain medium to amplify a wavelength tuned output beam, wherein the acousto-optic modulator is electronically controlled to produce the diffracted beam at a desired wavelength, wherein the first acousto-optic modulator comprises a first transparent material having a first end and a second end opposite the first end, a piezoelectric transducer at the first end of the first transparent material, the piezoelectric transducer being: controlled by a radiofrequency generator, and an acoustic absorber at the second end of the first transparent material: and f. a second acousto-optic modulator in between the first acousto-optic modulator and the first highly reflective mirror, the second acousto-optic modulator or comprising a second transparent material having a first end and a second end, a second piezoelectric transducer at the first end of the second transparent material and a second acoustic absorber at the second end of the second transparent material, wherein an orientation of the second acousto-optic modulator is reversed compared to the first acousto-optic modulator.

3. The quantum cascade laser of claim 2, wherein the quantum cascade laser is an infrared quantum cascade laser.

4. A quantum cascade laser, comprising;
a. a quantum cascade laser gain medium having a first end and a second end;
b. a first collimating lens adjacent to the first end of the gain medium and receiving an undiffracted output beam from the gain medium defining a first path;
c. an anti-reflection coating at the first end of the gain medium, facing the first collimating lens;
d. a first acousto-optic modulator adjacent to the collimating lens and opposite the gain medium and fixed in place, the first acousto-optic modulator receiving the undiffracted output beam directly from the collimating lens and subsequently emitting a diffracted beam along a second path;
e. a first highly reflective mirror positioned to receive the diffracted beam and reflect the diffracted beam back along the second path to the first acousto-optic modulator through the first path and back to the gain medium amplify wavelength tuned output beam, wherein the acousto-optic modulator is electronically controlled to produce the diffracted beam at a desired wavelength, where in the first acousto-optic modulator comprises a first transparent material having a first end and a second end opposite the first end, a piezoelectric transducer at the first end of the first transparent material, the piezoelectric transducer being controlled by a radiofrequency generator, and an acoustic absorber at the second end of the first transparent material;
f. a second collimating lens adjacent to the second end of the gain medium through which the wavelength tuned output beam is emitted; and
g. a second acousto-optic modulator in between the first acousto-optic modulator and the first highly reflective mirror, the second acousto-optic modulator comprising a second transparent material having a first end and a second end, a second piezoelectric transducer at the first end of the second transparent material, and a second acoustic absorber at the second end of the second transparent material, wherein an orientation of the second acousto-optic modulator is reversed compared to the first acousto-optic modulator.

5. A quantum cascade laser, comprising:
a. a quantum cascade laser gain medium having a first end and a second end;
b. a first collimating lens adjacent to the first end of the gain medium and receiving an undiffracted output beam from the gain medium defining a first path;
c. an anti-reflection coating at the first end of the gain medium, facing the first collimating lens, and a highly reflective coating adjacent to the second end of the gain medium;
d. a first acousto-optic modulator adjacent to the collimating, lens and opposite the gain medium and fixed in place, the first acousto-optic modulator receiving the undiffracted output beam directly from the collimating lens and subsequently emitting a diffracted beam along a second path;
e. a first highly reflective mirror positioned to receive the diffracted beam and reflect the diffracted beam back along the second path to the first acousto-optic modulator through the first path and back to the gain medium to amplify a wavelength tuned output beam, wherein the first acousto-optic modulator is electronically controlled to produce the diffracted beam at a desired wavelength, wherein the first acousto-optic modulator comprises a first transparent material having a first end and a second end opposite the first end, a first piezoelectric transducer at the first end of the first transparent material, the first piezoelectric transducer being controlled by a radiofrequency generator, and a first acoustic absorber at the second end of the first transparent material;
f. a plurality of highly reflective mirrors to form a ring laser resonator; and
g. a second acousto-optic modulator in between the first acousto-optic modulator and the first highly reflective mirror, the second acousto-optic modulator comprising a second transparent material having a first end and a second end, a second piezoelectric transducer at the first end of the second transparent material, and a second acoustic absorber at the second end of the second transparent material, wherein an orientation of the second acousto-optic modulator is reversed compared to the first acousto-optic modulator.

6. The quantum cascade laser of claim 5, further comprising a second collimating lens at the second end of the gain medium.

* * * * *